(12) United States Patent
Hayashi

(10) Patent No.: US 8,816,682 B2
(45) Date of Patent: Aug. 26, 2014

(54) MAGNETIC SENSOR

(75) Inventor: Kei Hayashi, Kyoto (JP)

(73) Assignee: Rohm Co., Ltd., Kyoto (JP)

(*) Notice: Subject to any disclaimer, the term of this patent is extended or adjusted under 35 U.S.C. 154(b) by 259 days.

(21) Appl. No.: 13/409,766

(22) Filed: Mar. 1, 2012

(65) Prior Publication Data

US 2012/0223704 A1    Sep. 6, 2012

(30) Foreign Application Priority Data

Mar. 2, 2011   (JP) .................................. 2011-44916

(51) Int. Cl.
   *G01R 33/02*   (2006.01)
   *G01R 33/07*   (2006.01)
   *G01R 33/00*   (2006.01)
   *G01D 5/14*    (2006.01)

(52) U.S. Cl.
   CPC .......... *G01R 33/072* (2013.01); *G01R 33/0023* (2013.01); *G01D 5/147* (2013.01)
   USPC ....................................................... 324/244

(58) Field of Classification Search
   CPC ... G01R 33/072; G01R 33/0023; G01D 5/147
   See application file for complete search history.

(56) References Cited

U.S. PATENT DOCUMENTS

| | | | |
|---|---|---|---|
| 7,701,208 B2* | 4/2010 | Nishikawa | 324/251 |
| 8,283,919 B2* | 10/2012 | Yano | 324/247 |
| 8,502,529 B2* | 8/2013 | Muraoka et al. | 324/244 |
| 2008/0265880 A1* | 10/2008 | Nishikawa | 324/251 |
| 2010/0207621 A1* | 8/2010 | Yano | 324/247 |

FOREIGN PATENT DOCUMENTS

| | | | | |
|---|---|---|---|---|
| EP | 1850143 A1 | * 10/2007 | | G01R 33/07 |
| JP | 3022957 | 1/2000 | | |
| JP | 2008-32431 | 2/2008 | | |

* cited by examiner

*Primary Examiner* — Jermele M Hollington
(74) *Attorney, Agent, or Firm* — Fish & Richardson P.C.

(57) ABSTRACT

A magnetic sensor includes a magneto-electric transducer, a switch circuit, an amplifier circuit, a subtractor circuit, and a selector circuit. The subtractor circuit performs a first subtraction process of generating a first subtraction voltage by subtracting an amplification voltage obtained under an immediately prior first bias state from an amplification voltage obtained under a second bias state and a second subtraction process of generating a second subtraction voltage by subtracting an amplification voltage obtained under an immediately prior second bias state from an amplification voltage obtained under a first bias state in a serial and parallel manner. The selector circuit alternately selects the first subtraction voltage and the second subtraction voltage to output a select voltage.

14 Claims, 12 Drawing Sheets

US 8,816,682 B2

MAGNETIC SENSOR

CROSS-REFERENCE TO RELATED APPLICATION(S)

This application is based upon and claims the benefit of priority from Japanese Patent Application No. 2011-044916, filed on Mar. 2, 2011, the entire contents of which are incorporated herein by reference.

TECHNICAL FIELD

The present disclosure relates to a magnetic sensor using a magneto-electric transducer (such as a Hall element, etc.).

BACKGROUND

Conventionally, there have been proposed and disclosed a variety of magnetic sensors using a Hall element.

One magnetic sensor in the related art can be used to measure the strength of a magnetic field with high precision by cancelling the off-set voltages of a Hall element or an amplifier. However, this conventional magnetic sensor needs to be improved in its sampling rate of the magnetic field and jitter characteristics (quantization noise).

Another magnetic sensor disclosed in the related art essentially differs from the magnetic sensor of the present disclosure and the above magnetic sensor in that the former requires an adder circuit, which performs an adding process for the output of an amplifier so as to cancel the off-set voltages of a Hall element or the amplifier. In addition, the magnetic sensor has several problems to be solved, such as a residual off-set after the adding process (before the differential process), insufficient gain of a final output signal, etc.

SUMMARY

The present disclosure provides some embodiments of a magnetic sensor that is capable of cancelling off-sets of a magneto-electric transducer or an amplifier and achieving high speed sampling of a magnetic field or an improvement to jitter characteristics.

According to one aspect of the present disclosure, provided is a magnetic sensor. The magnetic sensor includes a magneto-electric transducer, a switch circuit, an amplifier circuit, a subtractor circuit and a selector circuit. The magneto-electric transducer generates an output voltage depending on a strength of a magnetic field. The switch circuit alternately switches between a first bias state under which a bias voltage in a first direction is applied to the magneto-electric transducer to acquire the output voltage and a second bias state under which a bias voltage in a second direction perpendicular to the first direction is applied to the magneto-electric transducer to acquire the output voltage. The amplifier circuit generates an amplification voltage by amplifying the output voltage. The subtractor circuit performs a first subtraction process of generating a first subtraction voltage by subtracting an amplification voltage obtained under an immediately prior first bias state from an amplification voltage obtained under the second bias state and a second subtraction process of generating a second subtraction voltage by subtracting the amplification voltage obtained under an immediately prior second bias state from an amplification voltage obtained under the first bias state in a serial and parallel manner. The selector circuit alternately selects the first subtraction voltage and the second subtraction voltage to output a select voltage.

In one embodiment, the magnetic sensor further includes a filter circuit which generates a filtered voltage by smoothing out ripples of the select voltage.

In another embodiment, the amplifier circuit generates, as the amplification voltage, a positive phase amplification voltage and a negative phase amplification voltage which are in reverse phases.

In another embodiment, the subtractor circuit generates, as the first subtraction voltage, a first positive phase subtraction voltage and a first negative phase subtraction voltage. The first positive phase subtraction voltage is calculated by subtracting the positive phase amplification voltage obtained under the immediately prior first bias state from the positive phase amplification voltage obtained under the second bias state. The first negative phase subtraction voltage is calculated by subtracting the negative phase amplification voltage obtained under the immediately prior first bias state from the negative phase amplification voltage obtained under the second bias state. In addition, the subtractor circuit generates, as the second subtraction voltage, a second positive phase subtraction voltage and a second negative phase subtraction voltage. The second positive phase subtraction voltage is calculated by subtracting the positive phase amplification voltage obtained under the immediately prior second bias state from the positive phase amplification voltage obtained under the first bias state. The second negative phase subtraction voltage is calculated by subtracting the negative phase amplification voltage obtained under the immediately prior second bias state from the negative phase amplification voltage obtained under the first bias state.

In another embodiment, the selector circuit generates, as the select voltage, a first select voltage and a second select voltage. The first select voltage is alternately selected from the first positive phase subtraction voltage and the second negative phase subtraction voltage. The second select voltage is alternately selected from the first negative phase subtraction voltage and the second positive phase subtraction voltage.

In another embodiment, the filter circuit generates, as the filtered voltage, a first filtered voltage by smoothing out ripples of the first select voltage and a second filtered voltage by smoothing out ripples of the second select voltage.

In another embodiment, the magnetic sensor further includes a timing logic circuit which controls operation timings of the switch circuit, the subtractor circuit and the selector circuit in synchronization with a clock signal having a predetermined frequency.

In another embodiment, the subtractor circuit includes a first capacitor, a second capacitor, a third capacitor, a fourth capacitor, a first switch, a second switch, a third switch and a fourth switch. The first capacitor has a first end connected to an application terminal of the positive phase amplification voltage and a second end connected to an application terminal of the first positive phase subtraction voltage. The second capacitor has a first end connected to an application terminal of the negative phase amplification voltage and a second end connected to an application terminal of the second negative phase subtraction voltage. The third capacitor has a first end connected to the application terminal of the negative phase amplification voltage and a second end connected to an application terminal of the first negative phase subtraction voltage. The fourth capacitor has a first end connected to the application terminal of the positive phase amplification voltage and a second end connected to an application terminal of the second positive phase subtraction voltage. The first switch is connected between the second end of the first capacitor and an application terminal of a second reference voltage. The second switch is connected between the second end of the second capacitor and the application terminal of the second reference voltage. The third switch is connected between the second end of the third capacitor and an application terminal of a first reference voltage. The fourth switch is connected between the second end of the fourth capacitor and the application terminal of the first reference voltage.

In another embodiment, the timing logic circuit switches on the first switch and the third switch when the switch circuit is in the first bias state, and switches on the second switch and the fourth switch when the switch circuit is in the second bias state.

In another embodiment, the timing logic circuit switches off the first switch and the third switch before the switch circuit is switched from the first bias state to the second bias state, and switches off the second switch and the fourth switch before the switch circuit is switched from the second bias state to the first bias state.

In another embodiment, the selector circuit includes a fifth switch, a sixth switch, a seventh switch, an eighth switch, a fifth capacitor and a sixth capacitor. The fifth switch is connected between the application terminal of the first positive phase subtraction voltage and an application terminal of the first select voltage. The sixth switch is connected between the application terminal of the second negative phase subtraction voltage and the application terminal of the first select voltage. The seventh switch is connected between the application terminal of the first negative phase subtraction voltage and an application terminal of the second select voltage. The eighth switch is connected between the application terminal of the second positive phase subtraction voltage and the application terminal of the second select voltage. The fifth capacitor is connected between the application terminal of the first select voltage and a ground terminal. The sixth capacitor is connected between the application terminal of the second select voltage and the ground terminal.

In another embodiment, the timing logic circuit switches on the fifth switch and the seventh switch after switching off the first switch and the third switch, switches off the fifth switch and the seventh switch before switching on the first switch and the third switch, switches on the sixth switch and the eighth switch after switching off the second switch and the fourth switch, and switches off the sixth switch and the eighth switch before switching on the second switch and the fourth switch.

In another embodiment, the timing logic circuit switches on the sixth switch and the eighth switch with a lapse of a predetermined masking time after the switch circuit is switched from the second bias state to the first bias state, and switches on the fifth switch and the seventh switch with a lapse of a predetermined masking time after the switch circuit is switched from the first bias state to the second bias state.

In another embodiment, at least one of the first reference voltage and the second reference voltage has a variable voltage value.

In another embodiment, the magnetic sensor further includes a comparator circuit which compares the first filtered voltage with the second filtered voltage to generate a comparison output signal.

In another embodiment, the magnetic sensor further includes a differential amplifier circuit which amplifies a difference between the first filtered voltage and the second filtered voltage to generate a differential amplification signal.

In another embodiment, the magneto-electric transducer is a Hall element.

DETAILED DESCRIPTION

Magnetic sensors according to embodiments of the present disclosure will now be described in detail with reference to the drawings. The magnetic sensors of the present disclosure may be used as sensors for detecting a magnetic state (strength of a magnetic field), such as opening/closing detection sensors of folder type mobile phones, rotation position detection sensors of motors, etc. The magnetic sensors of the present disclosure may use a magneto-electric transducer, such as a Hall element, a magneto-resistive element, etc., which has its electric characteristics changed depending on a change in a magnetic field applied thereto, and can draw an output voltage based on such changed electric characteristics. In the following embodiments, the magnetic sensors are illustrated with Hall elements.

First Embodiment

Figure 1:
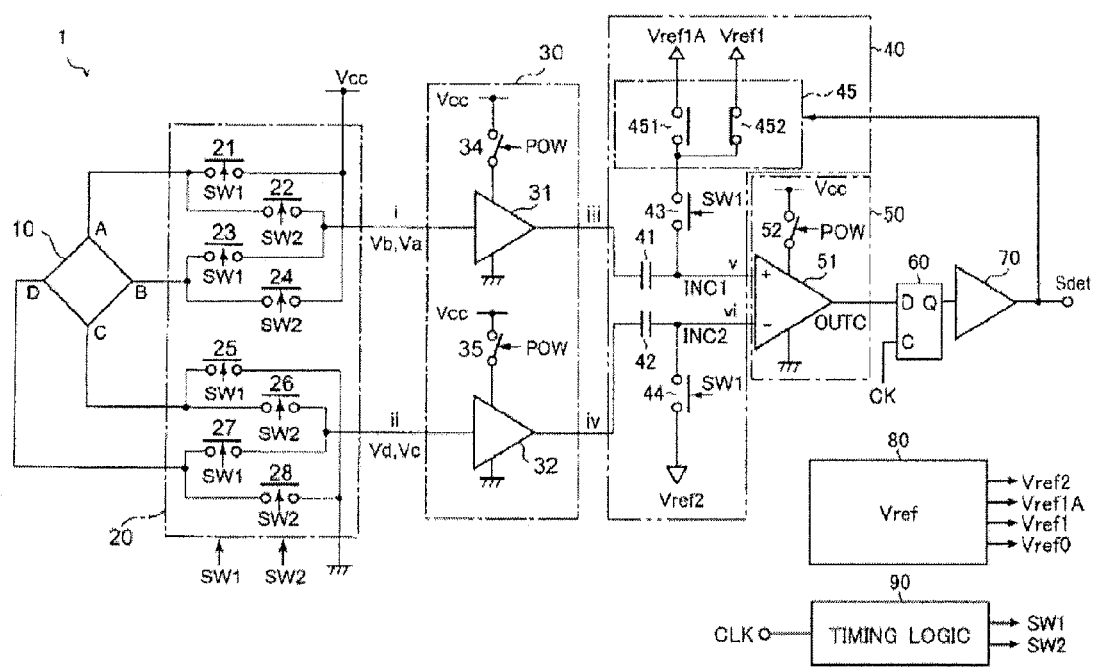
FIG. 1 is a view showing a magnetic sensor according to a first embodiment of the present disclosure.

FIG. 1 is a view showing a magnetic sensor according to a first embodiment of the present disclosure. A magnetic sensor 1 according to the first embodiment includes a Hall element 10, a switch circuit 20, an amplifier circuit 30, a subtractor circuit 40, a comparator circuit 50, a latch circuit 60, a buffer circuit 70, a reference voltage generator circuit 80 and a timing logic circuit 90. In the first embodiment, the magnetic sensor 1 outputs a detection signal Sdet with one of two values (high level and low level) depending on whether or not a magnetic field at the site of the magnetic sensor 1 exceeds a reference value.

The Hall element 10 has four terminals A to D, with a first pair of terminals A and C equivalent geometrically to a second pair of terminals B and D. In other words, the Hall element 10 is such configured that the first pair of terminals A and C coincides with the second pair of terminals B and D when rotated by 90 degrees around its center. In addition, in the magnetic sensor 1 of the first embodiment, the Hall element 10 has a shape of a square plate having four apexes on which the terminals A to D are respectively located.

In the Hall element 10, as configured above, if a Hall voltage $\Delta V(\phi 1)$ generated in the second pair of terminals B and D under a first bias state ($\phi 1$) is compared with a Hall voltage $\Delta V (\phi 2)$ generated in the first pair of terminals A and C under a second bias state ($\phi 2$), element off-set components (element off-set voltages), which are caused by manufacturing variations of the Hall element 10, are in phase, while effective signal components depending on the strength of a magnetic field applied to the Hall element 10 are in reversed phase. In this configuration, the first bias state (φ1) refers to a state where a source voltage Vcc is applied to the first pair of terminals A and C, while the second bias state (φ2) refers to a state where the source voltage Vcc is applied to the second pair of terminals B and D.

The switch circuit 20 includes a first group of switches 21, 23, 25 and 27 which are switched on/off according to a first switch control signal SW1, and a second group of switches 22, 24, 26 and 28 which are switched on/off according to a second switch control signal SW2. The switch circuit 20 performs a switch on/off control on the above switches to switch between application of the source voltage Vcc to the Hall element 10 (in a bias direction) and drawing a Hall voltage out of the Hall element 10.

The first switch control signal SW1 and the second switch control signal SW2 are generated in such a manner that their high level periods (switch-on periods) do not overlap with each other. Specifically, the first switch control signal SW1 has a high level (a logic level in switch-on) in the first half of a predetermined period during which a power-on signal POW has a high level (a logic level in power-on), and a low level (a logic level in switch-off) in the second half of the period. On the other hand, the second switch control signal SW2 has a high level (a logic level in switch-on) in the second half of the period during which the power-on signal POW has a high level (a logic level in power-on), and a low level (a logic level in switch-off) in the first half of the period. The power-on signal POW has a high level (a logic level in power-on) in a predetermined period in an intermittent manner, for example, for each certain cycle, and a low level (a logic level in power-off) in the remainder of the period.

Under the first bias state (φ1) where the first switch control signal SW1 has a high level, the source voltage Vcc is applied to the terminal A and the terminal C is connected to the ground. At this time, the Hall voltage $\Delta V(\phi 1)$ depending on the strength of a magnetic field is generated between the terminal B and the terminal D. Although the Hall voltage $\Delta V(\phi 1)$ generated between the terminal B and the terminal D varies depending on the direction of the magnetic field applied to the Hall element 10, it is here assumed that the terminal B has a lower voltage Vb and the terminal D has a higher voltage Vd. In the specification, "voltage" simply indicates a potential with respect to a ground, unless stated otherwise.

Switching from the first bias state (φ1) to the second bias state (φ2) is performed at a high speed, where the first bias state (φ1) refers to a state where the first switch control signal SW1 has a high level, and the second bias state (φ2) refers to the state where the second switch control signal SW2 has a high level. Accordingly, it is assumed that the magnetic field detected in the second bias state (φ2) has the same direction as the magnetic field detected in the first bias state (φ1).

Under the second bias state (φ2) where the second switch control signal SW2 has a high level, the source voltage Vcc is applied to the terminal B and the terminal D is connected to the ground. At this time, the Hall voltage $\Delta V(\phi 2)$ depending on the strength of a magnetic field is generated between the terminal A and the terminal C. Although the Hall voltage $\Delta V(\phi 2)$ generated between the terminal A and the terminal C varies depending on a direction of the magnetic field applied to the Hall element 10, it is here assumed that the terminal C has a lower voltage Vc and the terminal A has a higher voltage Va.

According to the operation as described above, a voltage of a first output terminal i of the switch circuit 20 corresponds to the voltage Vb in the first bias state (φ1) and the voltage Va in the second bias state (φ2). On the other hand, a voltage of a second output terminal ii of the switch circuit 20 corresponds to the voltage Vd in the first bias state (φ1) and the voltage Vc in the second bias state (φ2).

The amplifier circuit 30 includes a first amplifier 31, a second amplifier 32 and switches 34 and 35. The first amplifier 31 amplifies the voltage Vb or Va of the first output terminal i with a predetermined gain α to generate a first amplification voltage in a first amplification output terminal iii. It is here noted that the first amplifier 31 has an input off-set voltage Voffa1. Accordingly, the first amplifier 31 amplifies a voltage, which is obtained by adding the input off-set voltage Voffa1 of the first amplifier 31 to the voltage Vb or Va of the first output terminal i or subtracting the former from the latter, with the gain α. The second amplifier 32 amplifies the voltage Vd or Vc of the second output terminal ii with the predetermined gain α to generate a second amplification voltage in a second amplification output terminal iv. It is here noted that the second amplifier 32 has an input off-set voltage Voffa2. Accordingly, the second amplifier 32 amplifies a voltage, which is obtained by adding the input off-set voltage Voffa2 of the second amplifier 32 to the voltage Vd or Vc of the second output terminal ii or subtracting the former from the latter, with the gain α.

The first amplifier 31 is supplied with the source voltage Vcc via the switch 34 which is controlled to be switched on/off by the power-on signal POW. The second amplifier 32 is supplied with the source voltage Vcc via the switch 35 which is controlled to be switched on/off by the power-on signal POW. Accordingly, the amplifier circuit 30 is driven in a predetermined period in an intermittent manner, for example, for each certain cycle. In addition, if the first and second amplifiers 31 and 32 are of a current-driven type, the switches 34 and 35 may be current source circuits, each added with a switch function.

The subtractor circuit 40 includes a first capacitor 41, a second capacitor 42, switches 43 and 44 and a reference voltage switching unit 45. A first end of the first capacitor 41 is connected to the first amplification output terminal iii of the amplifier circuit 30. A second end of the first capacitor 41 is connected to a first comparison input terminal v of the comparator circuit 50. A first end of the second capacitor 42 is connected to the second amplification output terminal iv of the amplifier circuit 30. A second end of the second capacitor 42 is connected to a second comparison input terminal vi of the comparator circuit 50.

The second end of the first capacitor 41 (i.e., the first comparison input terminal v of the comparator circuit 50) is also connected to the reference voltage switching unit 45 via the switch 43, which is controlled to be switched on/off by the first switch control signal SW1. The reference voltage switching unit 45 applies one of a first reference voltage Vref1 and a modified first reference voltage Vref1A to the second end of the first capacitor 41 (i.e., the first comparison input terminal v of the comparator circuit 50) according to the detection signal Sdet. On the other hand, the second end of the second capacitor 42 (i.e., the second comparison input terminal vi of the comparator circuit 50) is connected to a second reference voltage Vref2 via the switch 44, which is controlled to be switched on/off by the first switch control signal SW1. It is here noted that the first reference voltage Vref1 is set to be lower by a predetermined value than the modified first reference voltage Vref1A. In addition, the modified first reference voltage Vref1A may be set to be lower by a predetermined value than the second reference voltage Vref2. It is, however, noted that the second reference voltage Vref2 may be used as the modified first reference voltage Vref1A.

The comparator circuit 50 includes a comparator 51 and a switch 52. The comparator 51 generates a comparison output signal OUTC by comparing a first comparison voltage INC1 inputted to the first comparison input terminal v (a non-inverted input terminal(+)) with a second comparison voltage INC2 inputted to the second comparison input terminal vi (an inverted input terminal(−)). The comparison output signal OUTC has a high level when the first comparison voltage INC1 is higher than the second comparison voltage INC2, and has a low level when the first comparison voltage INC1 is lower than the second comparison voltage INC2. The comparator 51 has a very high input impedance. For example, the input terminals of the comparator 51 are constituted by a MOS transistor circuit. The comparator 51 is supplied with the source voltage Vcc via the switch 52, which is controlled to be switched on/off by the power-on signal POW. Accordingly, the comparator circuit 50 is driven in a predetermined period in an intermittent manner, for example, for each certain cycle. In addition, the switch 52 may be a current source circuit added with a switch function.

When the comparison output signal OUTC of the comparator circuit 50 does not have a high level (i.e., no magnetic field is detected by the magnetic sensor 1), by actuation of the above-mentioned reference voltage switching unit 45, the first reference voltage Vref1 is applied to the first comparison input terminal v of the comparator circuit 50. On the other hand, when the comparison output signal OUTC of the comparator circuit 50 has a high level (i.e., a magnetic field is detected by the magnetic sensor 1), the modified first reference voltage Vref1A is applied to the first comparison input terminal v of the comparator circuit 50. This configuration allows a hysteresis characteristic to be provided for the comparator circuit 50, thereby allowing the magnetic field to be stably detected. In addition, a hysteresis width of the comparator circuit 50 may be easily changed by adjusting levels of the first reference voltage Vref1, the modified first reference voltage Vref1A and the second reference voltage Vref2.

The latch circuit 60 latches the comparison output signal OUTC of the comparator 50 at the timing when a pulse edge of a clock signal CK arrives. A D-type flip-flop inappropriate for the latch circuit 60.

The buffer circuit 70 generates the detection signal Sdet from a latch output of the latch circuit 70.

The reference voltage generator circuit 80 generates a reference voltage Vref0, the first reference voltage Vref1, the modified first reference voltage Vref1A and the second reference voltage Vref2 from the source voltage Vcc.

The timing logic circuit 90 generates the first and second switch control signals SW1 and SW2 in synchronization with a clock signal CLK having a predetermined frequency.

Figure 2:
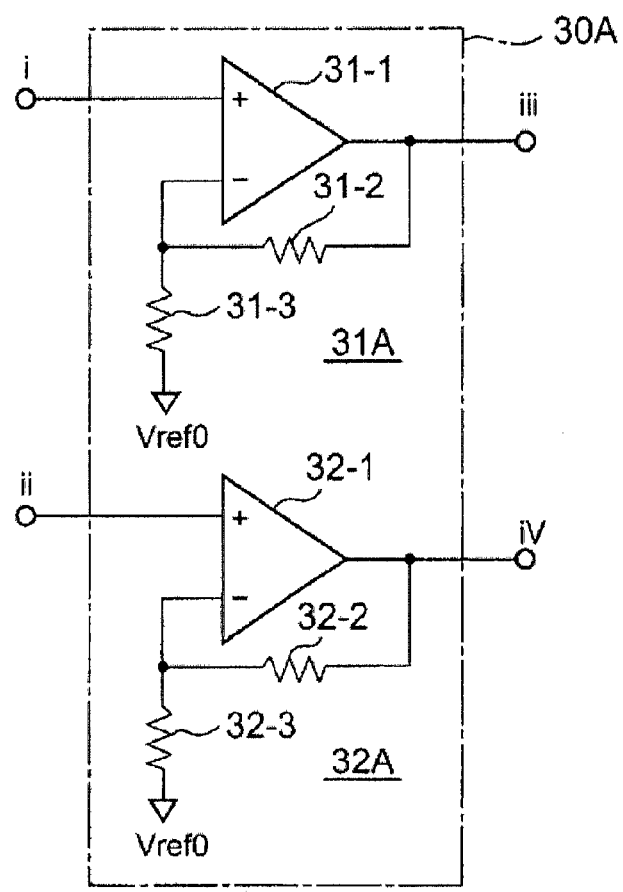
FIG. 2 is a view showing a first configuration of the amplifier circuit in FIG. 1.

FIG. 2 is a view showing a first configuration of the amplifier circuit 30. An amplifier circuit 30A in the first configuration includes a first amplifier 31A and a second amplifier 32A.

The first amplifier 31A includes an OP (operational) amplifier 31-1 and resistors 31-2 and 31-3. The resistor 31-2 is connected between an inverted input terminal(−) of the OP amplifier 31-1 and the first amplification output terminal iii. The resistor 31-3 is connected between the inverted input terminal(−) of the OP amplifier 31-1 and the reference voltage Vref0. A non-inverted input terminal(+) of the OP amplifier 31-1 is connected to the first output terminal i of the switch circuit 20. The first amplifier 31A as configured above amplifies the voltage Vb or Va of the first output terminal i with the predetermined gain α to output the first amplification voltage to the first amplification output terminal iii.

The second amplifier 32A includes an OP amplifier 32-1 and resistors 32-2 and 32-3. The resistor 32-2 is connected between an inverted input terminal(−) of the OP amplifier 32-1 and the second amplification output terminal iv. The resistor 32-3 is connected between the inverted input terminal (−) of the OP amplifier 32-1 and the reference voltage Vref0. A non-inverted input terminal(+) of the OP amplifier 32-1 is connected to the second output terminal ii of the switch circuit 20. The second amplifier 32A as configured above amplifies the voltage Vd or Vc of the second output terminal ii with the predetermined gain α to output the second amplification voltage to the second amplification output terminal iv.

In the amplifier circuit 30A of the first configuration, assuming that the resistances of the resistors 31-2 and 32-2 are both R2 and the resistances of the resistors 31-3 and 32-3 are both R1, the gains α of the first and second amplifiers 31A and 32A are both about R2/R1(R2>>R1).

Figure 3:
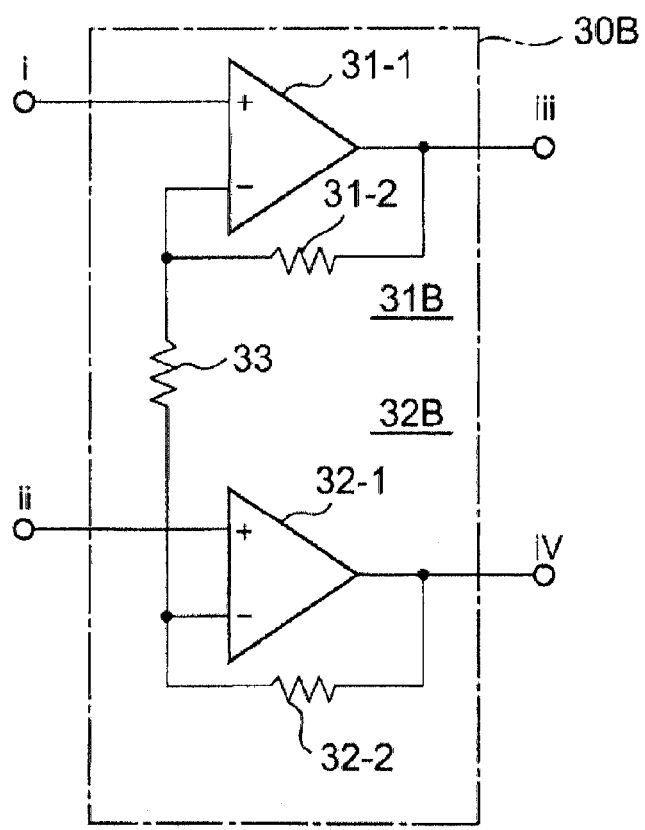
FIG. 3 is a view showing a second configuration of the amplifier circuit.

FIG. 3 is a view showing a second configuration of the amplifier circuit 30. An amplifier circuit 30B in the second configuration includes a first amplifier 31B, a second amplifier 32B and a resistor 33.

The first amplifier 31B includes an OP amplifier 31-1 and a resistor 31-2, and the second amplifier 32B includes an OP amplifier 32-1 and a resistor 32-2. The first and second amplifiers 31B and 32B share the resistor 33. The resistor 31-2 is connected between an inverted input terminal (−) of the OP amplifier 31-1 and the first amplification output terminal iii. A non-inverted input terminal (+) of the OP amplifier 31-1 is connected to the first output terminal i of the switch circuit 20. The resistor 32-2 is connected between an inverted input terminal (−) of the OP amplifier 32-1 and the second amplification output terminal iv. A non-inverted input terminal (+) of the OP amplifier 32-1 is connected to the second output terminal ii of the switch circuit 20. The resistor 33 is connected between the inverted input terminal(−) of the OP amplifier 31-1 and the inverted input terminal(−) of the OP amplifier 32-1.

In this manner, the amplifier circuit 30B in the second configuration is configured as an amplifier circuit where the first and second amplifiers 31B and 32B share the resistor 33, that is, of a balanced input-balanced output type. The amplifier circuit 30B in the second configuration can provide a lower number of resistive elements than the amplifier circuit 30A in the first configuration. In addition, unlike the amplifier circuit 30A in the first configuration, the amplifier circuit 30B in the second configuration may not set the reference voltage Vref0 since the reference voltages of the first and second amplifiers 31A and 31B are automatically set in the amplifier circuit 30B.

In addition, in comparison with the amplifier circuit 30A in the first configuration, the amplifier circuit 30B in the second configuration can increase the gain α by employing the specific balanced input-balanced output type. Specifically, in the amplifier circuit 30B of the second configuration, assuming that the resistances of the resistors 31-2 and 32-2 are both R2 and the resistance of the resistor 33 is R1, the gains α of the first and second amplifiers 31B and 32B are both about 2×R2/R1(R2>>R1). That is, in comparison with the amplifier circuit 30A of the first configuration, the amplifier circuit 30B of the second configuration can doubly increase the gain α. Such double increase of the gain α may improve a feasibility of a related circuit design and allows a Hall element having a low sensitivity to be more readily used in such circuit design.

Figure 4:
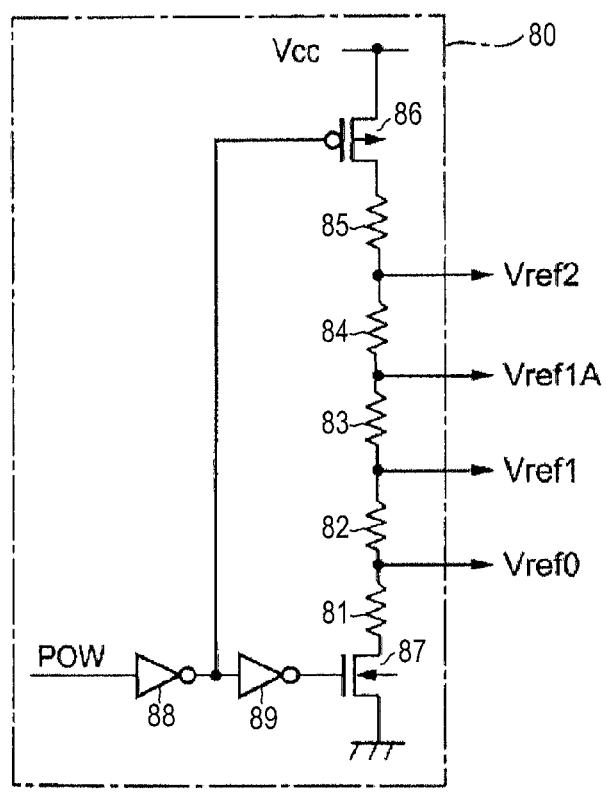
FIG. 4 is a view showing an exemplary configuration of the reference voltage generator circuit in FIG. 1.

FIG. 4 is a view showing an exemplary configuration of the reference voltage generator circuit 80. In the reference voltage generator circuit 80 of this configuration, the reference voltage Vref0, the first reference voltage Vref1, the modified first reference voltage Vref1A and the second reference voltage Vref2 are generated by dividing the source voltage Vcc with a resistor ladder (including resistors 81 to 85). The reference voltages are generated when a P-channel MOS (Metal Oxide Semiconductor) field effect transistor 86 provided at an upper part of the resistor ladder (i.e., the side of the source voltage Vcc) and an N-channel MOS field effect transistor 87 provided at a lower part of the resistor ladder (i.e., the side of the ground) are both turned on. The transistor 86 is controlled to be turned on/off according to the power-on signal POW which is inverted inputted through an inverter 88. On the other hand, the transistor 87 is controlled to be turned on/off according to the power-on signal POW which is non-inverted inputted through the inverter 88 and an inverter 89. Alternatively, the transistors 86 and 87 may be controlled to be turned on/off according to the first switch control signal SW1 instead of the power-on signal POW.

In order to provide high detection precision of the magnetic sensor 1, there is a need to limit the off-set signal components contained in an output signal of the amplifier circuit 30. Examples of the off-set signal components may include an off-set signal component contained in an output voltage of the Hall element 10 (hereinafter referred to as an "element off-set voltage") and an off-set signal component generated in an input terminal of the amplifier circuit 30 (hereinafter referred to as an "input off-set voltage"). The element off-set voltage of the Hall element 10 is mainly generated due to a stress subjected to the body of the Hall element 10, which is applied by a package of the magnetic sensor 1. The input off-set voltage of the amplifier circuit 30 is mainly generated due to variations of the characteristics of the elements constituting the input terminal of the amplifier circuit 30.

Figure 5:
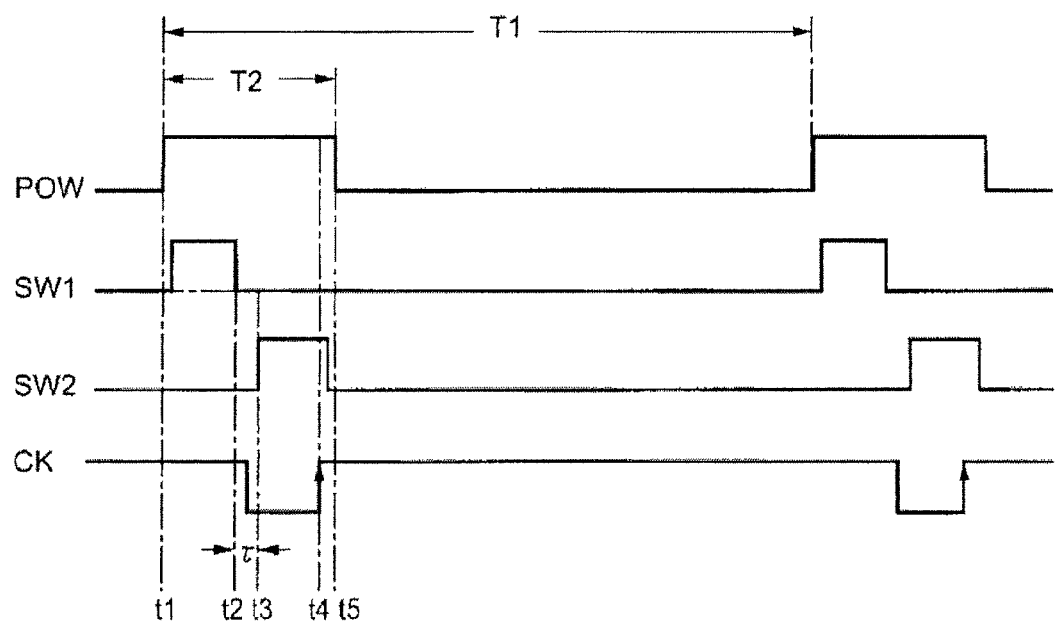
FIG. 5 is a timing chart for explaining an operation of the magnetic sensor 1 in FIG. 1.

The magnetic sensor 1 of the first embodiment is configured to generate a correct detection signal Sdet by cancelling both the element off-set voltage of the Hall element 10 and the input off-set voltage of the amplifier circuit 30. This operation of the magnetic sensor 1 will be described below with reference to FIG. 5. FIG. 5 is a timing chart for explaining the operation of the magnetic sensor 1, depicting the power-on signal POW, the first switch control signal SW1, the second switch control signal SW2 and the clock signal CK in descending order from the top.

First, the power-on signal POW has a high level during a predetermined period T2 every first cycle T1. This allows various components of the magnetic sensor 1, such as the amplifier circuit 30, the comparator circuit 50, the reference voltage generator circuit 80 and so on, to be intermittently supplied with the source voltage Vcc and, accordingly, made active. For example, for the purpose of detection of an opening/closing state of a mobile phone, the first cycle T1 and the predetermined period T2 may be set to 50 ms and 25 µs, respectively. This setting can prevent erroneous detection of the opening/closing state and suppress power consumption of the mobile phone, which results in extended battery driving time. In this manner, the first cycle T1 and the predetermined period T2 may be appropriately set depending on the uses of the magnetic sensor 1. In addition, the magnetic sensor 1 may be operated continuously instead of intermittently.

When the power-on signal POW has a high level at time t1, the first switch control signal SW1 also has a high level almost simultaneously. As the first switch control signal SW1 has a high level, the switch circuit 20 enters the first bias state ($\phi$1) by switching on the first group of switches 21, 23, 25 and 27. In addition, as the first switch control signal SW1 has a high level, the switches 43 and 44 included in the subtractor circuit 40 are switched on.

Under the first bias state ($\phi$1), the source voltage Vcc is applied to the first pair of terminals A and C of the Hall element 10 and a Hall voltage is generated in the second pair of terminals B and D. In this case, the voltage Vb is generated in the terminal B and the voltage Vd is generated in the terminal D. In addition, the above-mentioned element off-set voltage is included in the voltages Vb and Vd.

The Hall voltage generated in the second pair of terminals B and D of the Hall element 10 is inputted to the amplifier circuit 30 via the switch circuit 20. As a result, a first amplification voltage $\alpha$(Vb−Voffa1) obtained by amplifying the voltage Vb is generated in the first amplification output terminal iii of the amplifier circuit 30, and a second amplification voltage $\alpha$(Vd−Voffa2) obtained by amplifying the voltage Vd is generated in the second amplification output terminal iv. The symbol $\alpha$ refers to a gain of the amplifier circuit 30, and the symbols Voffa1 and Voffa2 refer to input off-set voltages of the first and second amplifiers 31 and 32, respectively.

In addition, under the first bias state ($\phi$1), the switches 43 and 44 included in the subtractor circuit 40 are switched on. With this configuration, if the comparison output signal OUTC of the comparator circuit 50 (as well as the detection signal Sdet of the magnetic sensor 1) does not have a high level, switches 451 and 452 included in the reference voltage switching unit 45 are switched off and on, respectively. Accordingly, the first and second reference voltages Vref1 and Vref2 are applied to the first and second comparison input terminals v and vi of the comparator circuit 50, respectively.

As a result, under the first bias state ($\phi$1), charges corresponding to a difference (Vref1−$\alpha$(Vb−Voffa1)) between the first reference voltages Vref1 and the first amplification voltage $\alpha$(Vb−Voffa1) are stored in both ends of the first capacitor 41. On the other hands, charges corresponding to a difference (Vref2−$\alpha$(Vd−Voffa2)) between the second reference voltages Vref2 and the second amplification voltage $\alpha$(Vd−Voffa2) are stored in both ends of the second capacitor 42.

At time t2, the first switch control signal SW1 has a low level and the first bias state ($\phi$1) is ended. Thereafter, at time t3, which corresponds to a delay by a predetermined short time $\tau$ from time t2, the second switch control signal SW2 has a high level. The predetermined short time $\tau$ makes it possible to set a period which belongs to neither the first bias state ($\phi$1) nor the second bias state ($\phi$2) between the first bias state ($\phi$1) and the second bias state ($\phi$2). This can prevent an unintended output component (the source voltage Vcc or the ground potential) from being outputted from the Hall element 10.

As the second switch control signal SW2 has a high level at time t3, the switch circuit 20 enters the second bias state ($\phi$2) by switching on the second group of switches 22, 24, 26 and 28. In addition, as the second switch control signal SW2 has a high level, the switches 43 and 44 included in the subtractor circuit 40 are switched off.

Under the second bias state ($\phi$2), the source voltage Vcc is applied to the second pair of terminals B and D of the Hall element 10, and a Hall voltage is generated in the first pair of terminals A and C. In this case, the voltage Va is generated in the terminal A and the voltage Vc is generated in the terminal C. In addition, the above-mentioned element off-set voltage is included in the voltages Va and Vc.

The Hall voltage generated in the first pair of terminals A and C of the Hall element 10 is inputted to the amplifier circuit 30 via the switch circuit 20. As a result, a first amplification voltage $\alpha$(Va−Voffa1) obtained by amplifying the voltage Va is generated in the first amplification output terminal iii of the amplifier circuit 30, and a second amplification voltage α(Vc−Voffa2) obtained by amplifying the voltage Vc is generated in the second amplification output terminal iv.

In addition, under the second bias state (φ2), the switches 43 and 44 included in the subtractor circuit 40 are switched off. At this point in time, since the comparison output signal OUTC of the comparator circuit 50 (further the detection signal Sdet of the magnetic sensor 1) does not have a high level yet, the switch 452 remains switched on in the reference voltage switching unit 45.

At this time, the charges stored in the first and second capacitors 41 and 42 under the first bias state (φ1) remain unchanged even under the second bias state (φ2). The first comparison voltage INC1 applied to the first comparison input terminal v of the comparator circuit 50 is expressed by the following equation (1-1) and the second comparison voltage INC2 applied to the second comparison input terminal vi of the comparator circuit 50 is expressed by the following equation (1-2).

$$INC1 = \{Vref1 - \alpha(Vb - Voffa1)\} - \alpha(Va - Voffa1) = Vref1 - \alpha(Vb - Va) \quad (1\text{-}1)$$

$$INC2 = \{Vref2 - \alpha(Vd - Voffa2)\} - \alpha(Vx - Voffa2) = Vref2 - \alpha(Vd - Vc) \quad (1\text{-}2)$$

As shown in the equations (1-1) and (1-2), the input off-set voltages Voffa1 and Voffa2 of the amplifier circuit 30 are not included in the first and second comparison voltages INC1 and INC2. That is, the input off-set voltages Voffa1 and Voffa2 cancel each other by the switching operation (the subtraction process in the subtractor circuit 40) between the first bias state (φ1) and the second bias state (φ2).

Thereafter, a comparison between the first and second comparison voltages INC1 and INC2 is made to generate the comparison output signal OUTC in the comparator circuit 50. The comparison output signal OUTC has a high level when the first comparison voltage INC 1 is higher than the second comparison voltage INC2, and has a low level when the first comparison voltage INC1 is lower than the second comparison voltage INC2. The following equation (1-3) is established between the first comparison voltage INC1 and the second comparison voltage INC2.

$$INC1 - INC2 = Vref1 - Vref2 - \alpha(Vb - Va) + \alpha(Vd - Vc) \quad (1\text{-}3)$$

However, as described above, the Hall voltage generated from the Hall element 10 contains effective signal components depending on the strength of the magnetic field applied to the Hall element 10 and element off-set components which are caused by the manufacturing variability of the Hall element 10. With this configuration, if a voltage generated in the second pair of terminals B and D of the Hall element 10 under the first bias state (φ1) is compared with a voltage generated in the first pair of terminals A and C under the second bias state (φ2), the element off-set components (element off-set voltages), which are caused by the manufacturing variability of the Hall element 10, are in phase, while the effective signal components depending on the strength of the magnetic field applied to the Hall element 10 are in reversed phase.

That is, assuming that element off-set voltages contained in the voltages Vb, Vd, Va and Vc are Vboffe, Vdoffe, Vaoffe and Vcoffe, respectively, a 90° offset equation of the Hall element 10 is expressed by the follow equation (1-4), which may be then modified to the following equation (1-5).

$$Vboffe - Vdoffe - Vaoffe - Vcoffe \quad (1\text{-}4)$$

$$Vboffe - Vaoffe = Vdoffe - Vcoffe \quad (1\text{-}5)$$

The equation (1-5) indicates that the element off-set voltages of the Hall element 10 cancel each other in the equation (1-3) showing the relationship between the first comparison voltage INC1 and the second comparison voltage INC2.

In this manner, the magnetic sensor 1 of the first embodiment can cancel both of the element off-set voltages of the Hall element and the input off-set voltages of the amplifier circuit 30 by the bias switching process of the switch circuit 20 and the subtraction process of the subtractor circuit 40.

Next, at time t4, the clock signal CK rises to a high level. The latch circuit 60 latches the comparison output signal OUTC from the comparison circuit 50 by triggering a rising edge of the clock signal CK. The buffer circuit 70 outputs a latch output of the latch circuit 60 as the detection signal Sdet.

Thereafter, at time t5, the power-on signal POW has a low level. When the power-on signal POW has a low level at time t5, the second switch control signal SW2 also has a low level almost simultaneously. It is here noted that the second switch control signal SW2 is formed by inverting and delaying the clock signal CK.

Under the second bias state (φ2), if the first comparison voltage INC1 is lower than the second comparison voltage INC2, the detection signal Sdet has a low level since the comparison output signal OUTC has a low level. On the other hand, if the first comparison voltage INC1 is higher than the second comparison voltage INC2, the detection signal Sdet has a high level since the comparison output signal OUTC has a high level.

If the detection signal Sdet has a high level, the switches 452 and 451 in the reference voltage switching unit 45 are switched off and on, respectively. This allows the modified first reference voltage Vref1A to be applied to the first comparison input terminal v of the comparator circuit 50 under the first bias state (φ1). Accordingly, a threshold value of the comparison operation in the comparator circuit 50 is set to be lower at a predetermined period T2 in the next cycle. That is, the comparator circuit 50 performs a hysteresis operation. A hysteresis width thereof is equal to a difference between Vref1A and Vref1. The hysteresis width can be easily designed and adjusted since the first reference voltage Vref1 and the modified first reference voltage Vref1A have only to be set.

The first and second reference voltages Vref1 and Vref2 may be set to half (Vcc/2) of the source voltage Vcc (or a voltage as close to the half voltage as possible). This setting can widen the dynamic range of input of the magnetic sensor 1.

In addition, by supplying the source voltage Vcc to the main circuit blocks such as the amplifier circuit 30, the comparator circuit 50 and so on intermittently every first cycle T1 and combining the intermittent operation with the latch operation by the detection signal Sdet, power consumption of the magnetic sensor 1 can be reduced without doing damage to the stable detection of the magnetic field.

Because of low power consumption due to the intermittent operation and stable detection of the magnetic field, the magnetic sensor 1 of the first embodiment is particularly suitable for mobile terminals (for example, folder type, rotation type, etc.) including a battery or the like as a power supply.

Although the above description has been provided on the premise that the magnetic field applied to the Hall element 10 is in a particular direction, it should be understood that a Hall voltage generated in the Hall element has a reversed polarity if the magnetic field applied to the Hall element 10 is in the opposite direction. In this case, the circuital design (appropriate setting of a reference voltage, and so on) of the magnetic sensor 1 may be made to meet the polarity of the Hall voltage generated in the Hall element 10.

Second Embodiment

Figure 6:
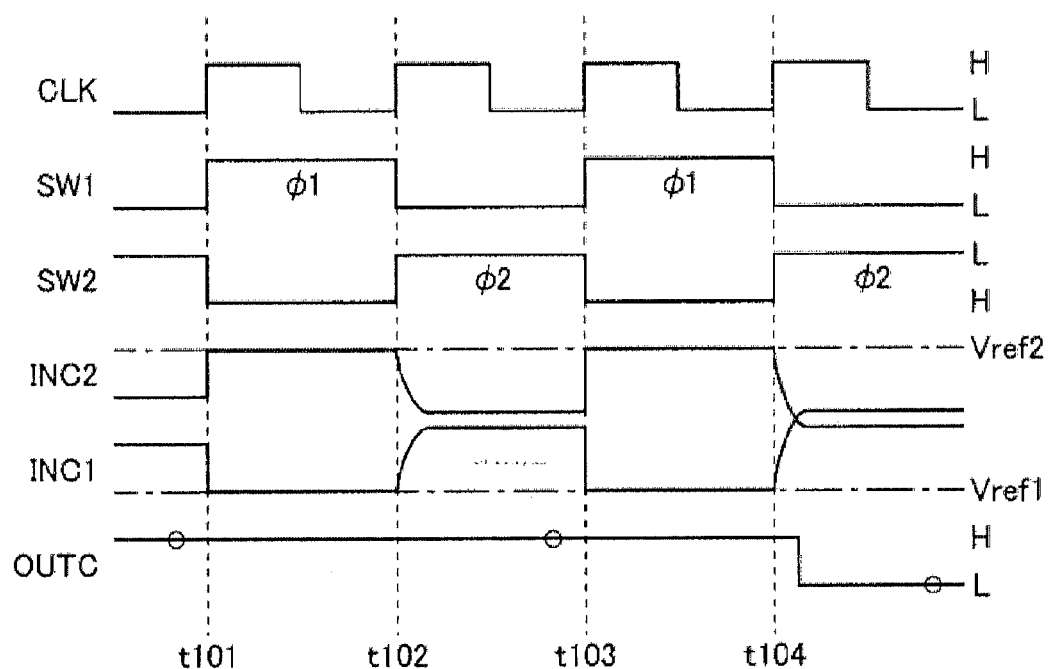
FIG. 6 is a timing chart for explaining a problem of the first embodiment.

FIG. 6 is a timing chart for explaining a problem of the first embodiment, depicting the clock signal CLK, the first switch control signal SW1, the second switch control signal SW2, the first comparison voltage INC1, the second comparison voltage INC2 and the comparison output signal OUTC in descending order from the top.

As described above, the magnetic sensor 1 of the first embodiment is configured to perform off-set cancellation by subtracting an amplifier output obtained under the immediately prior first bias state ($\phi1$) of the Hall element 10 from an amplifier output obtained under the second bias state ($\phi2$) of the Hall element 10, while alternating between the first bias state ($\phi1$) and the second bias state ($\phi2$). Here, the prior first bias state ($\phi1$) of the Hall element 10 refers to the state where the source voltage Vcc is applied to the first pair of terminals A and C. In addition, the second bias state ($\phi2$) of the Hall element 10 refers to the state where the source voltage Vcc is applied to the second pair of terminals B and D.

This configuration facilitates the measurement of the strength of a magnetic field with high precision by cancelling the element off-set voltages of the Hall element 10 and/or the input off-set voltages of the amplifier circuit 30. In addition, the magnetic sensor 1 of the first embodiment does not requires an adder circuit for performing an adding process for amplifier output, thereby overcoming problems such as residual off-set after the adding process, insufficient gain of a final output signal, etc.

However, in the magnetic sensor 1 of the first embodiment, a direction of the subtracting process in the subtractor circuit 40 is limited to "$\phi2-\phi1$." Accordingly, in order for the magnetic sensor 1 of the first embodiment to obtain the first and second comparison voltages INC1 and INC2 with their off-sets cancelling each other (i.e., subjected to the subtraction process), there is need of a clock signal CLK of two cycles and there is left room for further improvement in a sampling rate of the magnetic field and jitter characteristics (quantization noise).

Figure 7:
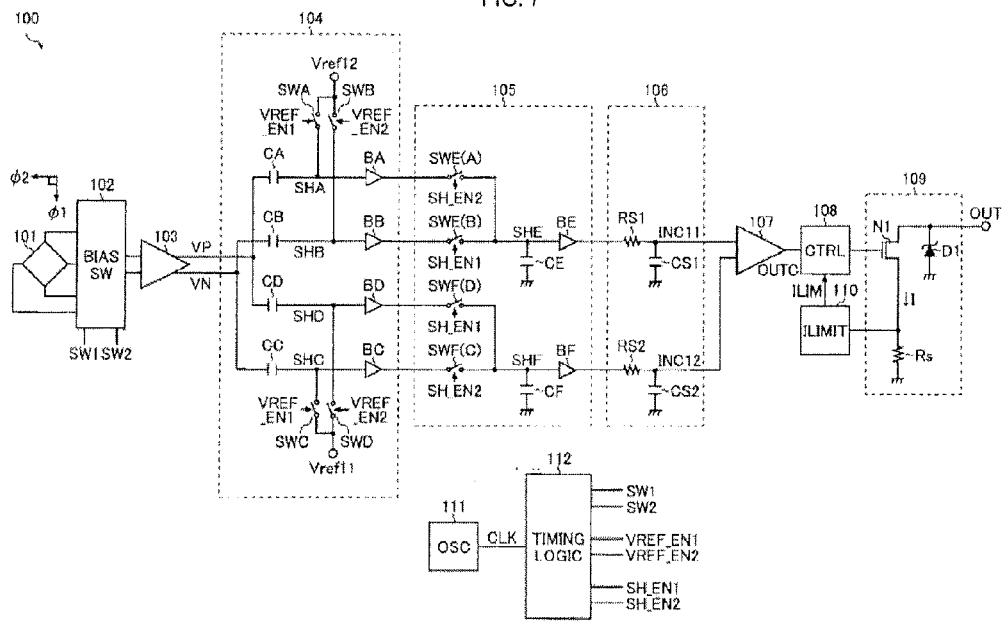
FIG. 7 is a view showing a magnetic sensor according to a second embodiment of the present disclosure.

FIG. 7 is a view showing a magnetic sensor according to a second embodiment of the present disclosure. A magnetic sensor 100 according to the second embodiment includes a Hall element 101, a switch circuit 102, an amplifier circuit 103, a subtractor circuit 104, a selector circuit 105, a low pass filter circuit 106, a comparator circuit 107, an output control circuit 108, an output circuit 109, a current limiter circuit 110, an oscillator circuit 111 and a timing logic circuit 112.

The Hall element 101 is a magneto-electric transducer which generates a Hall voltage depending on the strength of a magnetic field applied thereto. The Hall element 101 has the same configuration and operation as the Hall element 10 of the first embodiment and therefore, explanation of which will not be repeated.

The switch circuit 102 alternates between a first bias state ($\phi1$) under which a bias voltage in a first direction is applied to the Hall element 101 to acquire a Hall voltage and a second bias state ($\phi2$) under which a bias voltage in a second direction perpendicular to the first direction is applied to the Hall element 101 to acquire a Hall voltage. The switch circuit 102 has the same configuration and operation as the switch circuit 20 of the first embodiment and therefore, explanation of which will not be repeated.

The amplifier circuit 103 amplifies the Hall voltages inputted through the switch circuit 102 to generate amplification voltages (a positive phase amplification voltage VP and a negative phase amplification voltage VN which are in reversed phase). The amplifier circuit 103 has the same configuration and operation as the amplifier circuit 30 of the first embodiment and therefore, explanation of which will not be repeated.

The subtractor circuit 104 includes capacitors CA to CD, switches SWA to SWD and buffers BA to BD. A first end of the capacitor CA is connected to an application terminal of the positive phase amplification voltage VP. A second end of the capacitor CA is connected to a n application terminal of a first positive phase subtraction voltage SHA. A first end of the capacitor CB is connected to an application terminal of the negative phase amplification voltage VN. A second end of the capacitor CB is connected to an application terminal of a second negative phase subtraction voltage SHB. A first end of the capacitor CC is connected to the application terminal of the negative phase amplification voltage VN. A second end of the capacitor CC is connected to an application terminal of a first negative phase subtraction voltage SHC. A first end of the capacitor CD is connected to the application terminal of the positive phase amplification voltage VP. A second end of the capacitor CD is connected to an application terminal of a second positive phase subtraction voltage SHD. The switch SWA is connected between the second end of the capacitor CA and an application terminal of a second reference voltage Vref12. The switch SWB is connected between the second end of the capacitor CB and the application terminal of the second reference voltage Vref12. The switch SWC is connected between the second end of the capacitor CC and an application terminal of a first reference voltage Vref11. The switch SWD is connected between the second end of the capacitor CD and the application terminal of the first reference voltage Vref11. The buffer BA is connected between the application terminal of the first positive phase subtraction voltage SHA and the selector circuit 105. The buffer BB is connected between the application terminal of the second negative phase subtraction voltage SHB and the selector circuit 105. The buffer BC is connected between the application terminal of the first negative phase subtraction voltage SHC and the selector circuit 105. The buffer BD is connected between the application terminal of the second positive phase subtraction voltage SHD and the selector circuit 105.

The subtractor circuit 104 as configured above is a first sample/hold circuit which performs a first subtraction process ($\phi2-\phi1$) and a second subtraction process ($\phi1-\phi2$) in a serial/parallel manner. The first subtraction process ($\phi2-\phi1$) refers to a subtraction process for generating the first positive phase subtraction voltage SHA and the first negative phase subtraction voltage SHC by subtracting a positive phase amplification voltage VP($\phi1$) and a negative phase amplification voltage VN($\phi1$) obtained under the first bias state ($\phi1$) from a positive phase amplification voltage VP($\phi2$) and a negative phase amplification voltage VN($\phi2$) obtained under the second bias state ($\phi2$), respectively. On the other hand, the second subtraction process ($\phi1-\phi2$) refers to a subtraction process for generating the second positive phase subtraction voltage SHD and the second negative phase subtraction voltage SHB by subtracting the positive phase amplification voltage VP($\phi2$) and the negative phase amplification voltage VN($\phi2$) obtained under the second bias state ($\phi2$) from the positive phase amplification voltage VP($\phi1$) and the negative phase amplification voltage VN($\phi1$) obtained under the first bias state ($\phi1$), respectively.

The selector circuit 105 includes switches SWE(A), SWE (B), SWF(C) and SWF(D), capacitors CE and CF and buffers BE and BF. The switch SWE(A) is connected between the application terminal of the first positive subtraction voltage SHA (an output terminal of the buffer BA) and an application terminal of a first select voltage SHE. The switch SWE(B) is connected between the application terminal of the second negative subtraction voltage SHB (an output terminal of the buffer BB) and the application terminal of the first select voltage SHE. The switch SWF(C) is connected between the application terminal of the first negative subtraction voltage SHC (an output terminal of the buffer BC) and an application terminal of a second select voltage SHF. The switch SWF(D) is connected between the application terminal of the second positive subtraction voltage SHD (an output terminal of the buffer BD) and the application terminal of the second select voltage SHF. The capacitor CE is connected between the application terminal of the first select voltage SHE and the ground. The capacitor CF is connected between the application terminal of the second select voltage SHF and the ground. The buffer BE is connected between the application terminal of the first select voltage SHE and the low pass filter circuit 106. The buffer BF is connected between the second select voltage SHF and the low pass filter circuit 106. The selector circuit 105 as configured above acts as a second sample/hold circuit which generates the first select voltage SHE and the second select voltage SHF. The first select voltage is alternately selected from the first positive phase subtraction voltage SHA and the second negative phase subtraction voltage SHB. The second select voltage SHF is alternately selected from the first negative phase subtraction voltage SHC and the second positive phase subtraction voltage SHD.

The low pass filter circuit 106 includes resistors RS1 and RS2 and capacitors CS1 and CS2. A first end of the resistor RS1 is connected to the application terminal of the first select voltage SHE (an output terminal of the buffer BE). A second end of the resistor RS1 is connected to an application terminal of a first filtered voltage (a first comparison voltage) INC11. A first end of the resistor RS2 is connected to the application terminal of the second select voltage SHF (an output terminal of the buffer BF). A second end of the resistor RS2 is connected to an application terminal of a second filtered voltage (a second comparison voltage) INC12. The capacitor CS1 is connected between the application terminal of the first filtered voltage INC11 and the ground. The capacitor CS2 is connected between the application terminal of the second filtered voltage INC12 and the ground. The low pass filter circuit 106 as configured above generates the first filtered voltage INC11 and the second filtered voltage INC12 by smoothing the first select voltage SHE and the second select voltage SHF, respectively.

The comparator circuit 107 compares the first filtered voltage INC11 with the second filtered voltage INC12 to generate a comparison output signal OUTC.

The output control circuit 108 performs driving control of the output circuit 109 (turning-on/off control of a transistor N1) according to the comparison output signal OUTC inputted from the comparator circuit 107. In addition, the output control circuit 108 performs driving control of the output circuit 109 (conductivity control (on-resistance control) of the transistor N1) according to a current limit signal ILIM inputted from the current limiter circuit 110.

The output circuit 109 includes the N-channel MOS field effect transistor N1 forming an open drain output stage, a Zener diode D1 for protection against electrostatic breakdown, and a sense resistor Rs for detecting current I flowing through the transistor N1 as a voltage signal. The transistor N1 is turned off when the comparison output signal OUTC has a high level, and is turned on when the comparison output signal OUTC has a low level, according to an instruction from the output control circuit 108. According to such turning-on/off control, an output signal OUT having the same logic as the comparison output signal OUTC is outputted from the magnetic sensor 100 to the outside.

If the current I flowing through the transistor N1 exceeds a predetermined upper limit, the current limiter circuit 110 outputs the current limit signal ILIM to the output control circuit 108 which instructs the output control circuit 108 to decrease a gate voltage of the transistor N1 to increase on-resistance of the transistor N1.

The oscillator circuit 111 generates a clock signal CLK having a predetermined frequency and supplies it to the timing logic circuit 112.

In synchronization with the clock signal CLK, the timing logic circuit 112 generates a first switch control signal SW1, a second switch control signal SW2, a first subtraction control signal VREF_EN1, a second subtraction control signal VREF_EN2, a first select control signal SH_EN1 and a second select control signal SH_EN2, and controls operation timings of the switch circuit 102, the subtractor circuit 104 and the selector circuit 105.

The first switch control signal SW1 and the second switch control signal SW2 are control signals for switching the bias direction of the Hall element 101 vertically)(0°/90° and are both supplied to the switch circuit 102. The first subtraction control signal VREF_EN1 is a switching-on/off control signal of the switches SWA and SWC. The second subtraction control signal VREF_EN2 is a switching-on/off control signal of the switches SWB and SWD. The first subtraction control signal VREF_EN1 and the second subtraction control signal VREF_EN2 are both supplied to the subtractor circuit 104. The first select control signal SH_EN1 is a switching-on/off control signal of the switches SWE(B) and SWF(D). The second select control signal SH_EN2 is a switching-on/off control signal of the switches SWE(A) and SWF(C). The first select control signal SH_EN1 and the second select control signal SH_EN2 are both supplied to the selector circuit 105.

Figure 8:
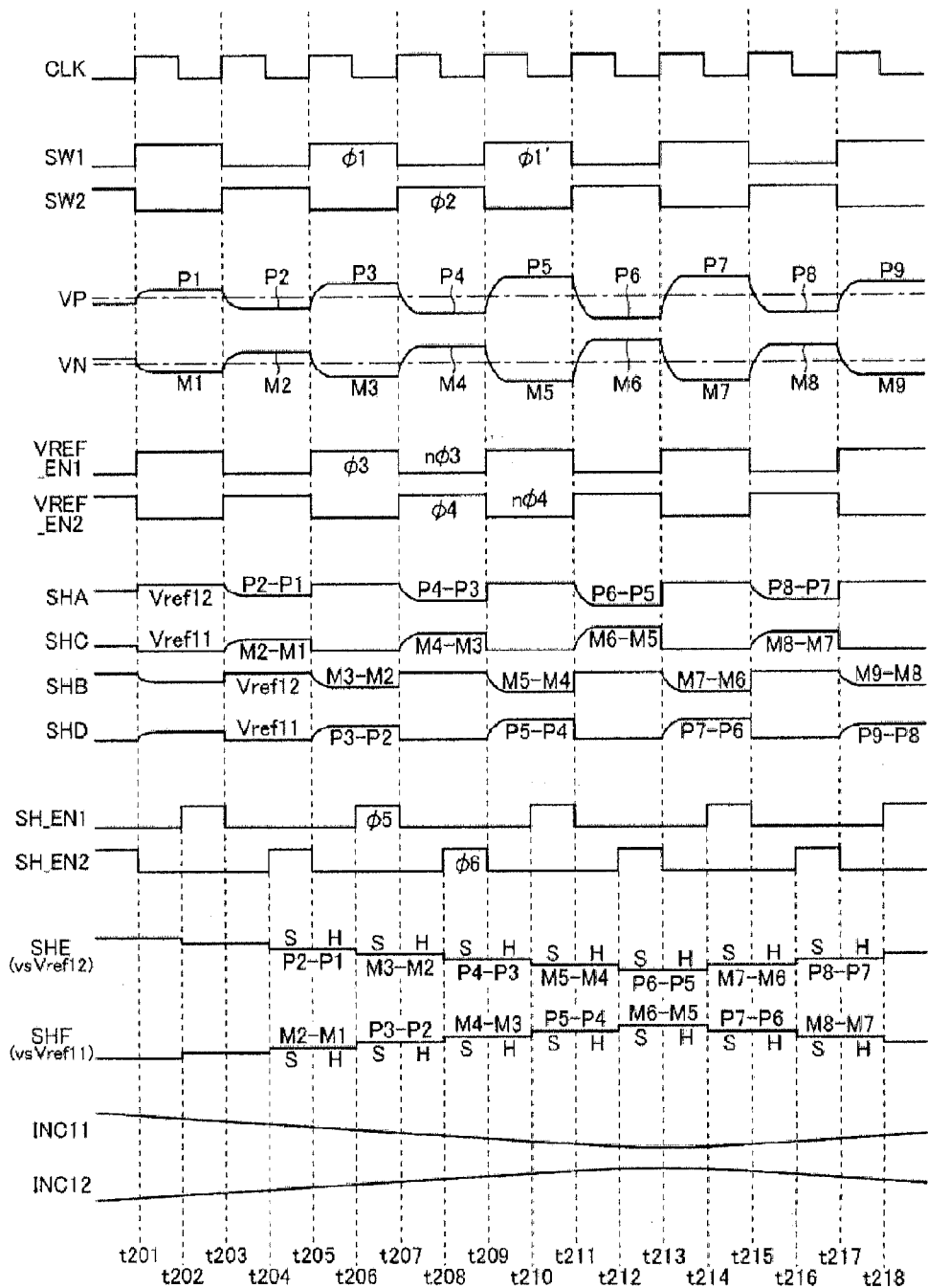
FIG. 8 is a timing chart for explaining an operation of the magnetic sensor in FIG. 7.

Next, an operation of the magnetic sensor 100 as configured above will be described with reference to FIG. 8. FIG. 8 is a timing chart for explaining an operation of the magnetic sensor 100, depicting the clock signal CLK, the first switch control signal SW1, the second switch control signal SW2, the positive phase amplification voltage VP, the negative phase amplification voltage VN, the first subtraction control signal VREF_EN1, the second subtraction control signal VREF_EN2, the first positive phase subtraction voltage SHA, the first negative phase subtraction voltage SHC, the second negative phase subtraction voltage SHB, the second positive phase subtraction voltage SHD, the first select control signal SH_EN1, the second select control signal SH_EN2, the first select voltage SHE, the second select voltage SHF, the first filtered voltage INC11 and the second filtered voltage INC12 in descending order from the top.

[First Subtraction Process ($\phi 2-\phi 1$) in Subtractor Circuit 104]

It is here assumed that a Hall output voltage $\Delta V(\phi 1)$ (=VH1+$\Delta$VOFF1) is generated in the Hall element 101 under the first bias state ($\phi 1$) under which the first switch control signal SW1 has a high level (for example, see times t205 to t207 in FIG. 8), where VH1 denotes an effective signal component and $\Delta$VOFF1 denotes an element off-set component (element off-set voltage).

With this configuration, the positive phase amplification voltage VP($\phi 1$) and the negative phase amplification voltage VN($\phi 1$) outputted from the amplifier circuit 103 are expressed by the following equations (2-1) and (2-2), respectively. The symbol a denotes a differential gain of the amplifier circuit 103 and ΔVOFF_AMP denotes an input off-set voltage of the amplifier circuit 103. VP0 and VN0 denote ideal amplifier output voltages for a differential input voltage of 0V. For example, at times t205 to t207 in FIG. 8, the value of the positive phase amplification voltage VP(φ1) is "P3" and the value of the negative phase amplification voltage VN (φ1) is "M3."

$$VP(\phi1)=+(\alpha/2)\times(VH1+\Delta VOFF1+\Delta VOFF\_AMP)+VP0 \quad (2\text{-}1)$$

$$VN(\phi1)=-(\alpha/2)\times(VH1+\Delta VOFF1+\Delta VOFF\_AMP)+VN0 \quad (2\text{-}2)$$

When the first subtraction control signal VREF_EN1 has a high level, the switches SWA and SWC are switched on and, accordingly, the subtractor circuit 104 enters a first sampling state (φ3). As a result, a difference (VP(φ1)−Vref12) between the second reference voltage Vref12 and the positive phase amplification voltage VP (φ1) is charged in the capacitor CA and a difference (VN(φ1)−Vref11) between the first reference voltage Vref11 and the negative phase amplification voltage VN(φ1) is charged in the capacitor CC.

Thereafter, when the first subtraction control signal VREF_EN1 has a low level, the switches SWA and SWC are switched off and, accordingly, the subtractor circuit 104 enters a first holding state (nφ3). As a result, an application terminal of the first positive phase subtraction voltage SHA and an application terminal of the first negative phase subtraction voltage SHC are floated to conserve charges stored in the capacitors CA and CC. This allows the positive phase amplification voltage VP(φ1) and the negative phase amplification voltage VN(φ1) obtained under the first bias state (φ1) to be held by the subtractor circuit 104.

Next, the bias voltage application direction is switched to the vertical direction different from before under the second bias state (φ2) under which the second switch control signal SW2 has a high level (for example, see times t207 to t209 in FIG. 8). Accordingly, a Hall output voltage ΔV02 generated in the Hall element 101 is −VH2+ΔVOFF2, where VH2 denotes an effective signal component and ΔVOFF2 denotes an element off-set component (element off-set voltage).

With this configuration, the positive phase amplification voltage VP(φ2) and the negative phase amplification voltage VN(φ2) outputted from the amplifier circuit 103 are expressed by the following equations (2-3) and (2-3), respectively. The symbol a denotes a differential gain of the amplifier circuit 103 and ΔVOFF_AMP denotes an input off-set voltage of the amplifier circuit 103. VP0 and VN0 denote ideal amplifier output voltages for a differential input voltage of 0V. For example, at times t207 to t209 in FIG. 8, the value of the positive phase amplification voltage VP(φ2) is "P4" and the value of the negative phase amplification voltage VN(φ2) is "M4."

$$VP(\phi2)=+(\alpha/2)\times(-VH2+\Delta VOFF2+\Delta VOFF\_AMP)+VP0 \quad (2\text{-}3)$$

$$VN(\phi2)=-(\alpha/2)\times(-VH2+\Delta VOFF2+\Delta VOFF\_AMP)+VN0 \quad (2\text{-}4)$$

At this time, under a state where the first subtraction control signal VREF_EN1 has a low level, i.e., under the first holding state (nφ3) of the subtractor circuit 104, the first positive phase subtraction voltage SHA and the first negative phase subtraction voltage SHC are expressed by the following equations (2-5) and (2-6), respectively, based on the charge conservation in the capacitors CA and CC. For example, at times t207 to t209 in FIG. 8, the value of the first positive phase subtraction voltage SHA is "P4−P3+Vref12" and the value of the first negative phase subtraction voltage SHC is "M4−M3+Vref11."

$$SHA=VP(\phi2)-\{VP(\phi1)-Vref12\} \quad (2\text{-}5)$$

$$SHC=VN(\phi2)-\{VN(\phi1)-Vref11\} \quad (2\text{-}6)$$

Putting the equations (2-1) and (2-3) in the equation (2-5), the first positive phase subtraction voltage SHA is expressed by the following equation (2-7). Putting the equations (2-2) and (2-4) in the equation (2-6), the first negative phase subtraction voltage SHC is expressed by the following equation (2-8). It is here assumed that VH1=VH2=VH and ΔVOFF1=ΔVOFF2.

$$\begin{aligned}SHA &= +(\alpha/2)\times(-VH2+\Delta VOFF2+\Delta VOFF\_AMP)+ \\ & \quad VP0-(\alpha/2)\times(VH1+\Delta VOFF1+\Delta VOFF\_AMP)- \\ & \quad VP0+Vref12 \\ &= -\alpha\times VH+Vref12\end{aligned} \quad (2\text{-}7)$$

$$\begin{aligned}SHC &= -(\alpha/2)\times(-VH2+\Delta VOFF2+\Delta VOFF\_AMP)+ \\ & \quad VN0+(\alpha/2)\times(VH1+\Delta VOFF1+\Delta VOFF\_AMP)- \\ & \quad VN0+Vref11 \\ &= +\alpha\times VH+Vref11\end{aligned} \quad (2\text{-}8)$$

As can be seen from the above equations (2-7) and (2-8), the element off-set voltages ΔVOFF1 and ΔVOFF2 of the Hall element 101 and the input off-set voltage ΔVOFF_AMP of the amplifier circuit 103 are all cancelled out according to the first subtraction process (φ2−φ1) of the subtractor circuit 104.

Corresponding to the effective signal component VH differentially inputted from the Hall element 101, an effective signal component (SHA−SHC) differentially outputted from the subtractor circuit 104 is −α×2×VH+(Vref12−Vref11). That is, the off-set cancellation using the subtractor circuit 104 can provide a detection signal gain which is twice that of the off-set cancellation using an adder circuit in the related art.

In addition, the off-set cancellation using the subtractor circuit 104 can provide a hysteresis characteristic for the comparator circuit 107 by setting a predetermined difference between the first reference voltage Vref11 and the second reference voltage Vref12. Accordingly, in a single-pole magnetic field detection type or an alternating magnetic field detection type using the comparator circuit 107, a detection threshold value of the strength of the magnetic field can be arbitrarily adjusted by appropriately setting the difference between the first reference voltage Vref11 and the second reference voltage Vref12.

Figure 10:
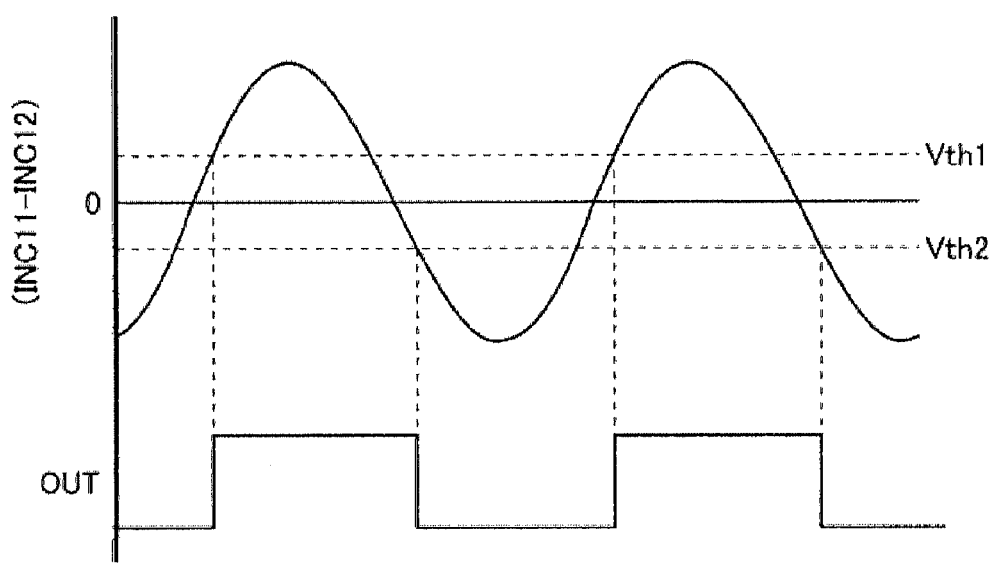
FIG. 10 is a timing chart showing an example of threshold value setting for detection of an alternating magnetic field.

For example, by dynamically controlling at least one of the first reference voltage Vref11 and the second reference voltage Vref12 such that a magnitude relationship between the first reference voltage Vref11 and the second reference voltage Vref12 (indicating which one is higher than the other) becomes reversed depending on whether or not a magnetic field is detected, the hysteresis characteristic crossing a zero value can be provided to the comparator circuit 107, as shown in FIG. 10, thereby allowing stable detection of the magnetic field with the alternating magnetic field detection type.

On the other hand, for an analog linear output type using a differential amplifier circuit instead of the comparator circuit 107, the first reference voltage Vref11 and the second reference voltage Vref12 may be set to be equal to each other with no difference therebetween. Although the reference voltage generator circuit 80 and the reference voltage switching unit 45 shown in FIG. 1 are not specified in FIG. 7, it should be understood that these circuit blocks are provided as necessary in the magnetic sensor 100 according to the second embodiment.

[Second Subtraction Process (φ1'–φ2) in Subtractor Circuit 104]

Under the second bias state (φ2) under which the second switch control signal SW2 has a high level (for example, see times t207 to t209 in FIG. 8), the subtractor circuit 104 performs the second subtraction process (φ1'–φ2) using the capacitors CB and CD in parallel to the first subtraction process (φ2–φ1) using the capacitors CA and CC. It is here assumed that switching between bias states is performed in the order of φ1→φ2→φ1'.

As described above, under the second bias state (φ2) under which the second switch control signal SW2 has a high level, the positive phase amplification voltage VP(φ2) and the negative phase amplification voltage VN(φ2) outputted from the amplifier circuit 103 are expressed by the following equations (2-3) and (2-4), respectively. For example, at times t207 to t209 in FIG. 8, the value of the positive phase amplification voltage VP(φ2) is "P4" and the value of the negative phase amplification voltage VN(φ2) is "M4,"

When the second subtraction control signal VREF_EN2 has a high level, the switches SWB and SWD are switched on and, accordingly, the subtractor circuit 104 enters a second sampling state (φ4). As a result, a difference (VN(φ2)–Vref12) between the second reference voltage Vref12 and the negative phase amplification voltage VN(φ2) is charged in the capacitor CB and a difference (VP(φ2)–Vref11) between the first reference voltage Vref11 and the positive phase amplification voltage VP(φ2) is charged in the capacitor CD.

In addition, in comparing the first bias state (φ1/φ1') with the second bias state (φ2), the phase of the Hall voltage is reversed. Accordingly, in comparing the first subtraction process (φ2–φ1) with the second subtraction process (φ1'–φ2), an application destination of the first reference voltage Vref11 is reverse to an application destination of the second reference voltage Vref12.

Thereafter, when the second subtraction control signal VREF_EN2 has a low level, the switches SWB and SWD are switched off and, accordingly, the subtractor circuit 104 enters a second holding state (nφ4). As a result, an application terminal of the second positive phase subtraction voltage SHD and an application terminal of the second negative phase subtraction voltage SHB are floated to conserve the charges stored in the capacitors CD and CB. This allows the positive phase amplification voltage VP(φ2) and the negative phase amplification voltage VN(φ2) obtained under the second bias state (φ2) to be held by the subtractor circuit 104.

Next, the bias voltage application direction is switched to a vertical direction different from before under the first bias state (φ1') under which the first switch control signal SW1 has a high level (for example, see times t209 to t211 in FIG. 8). Accordingly, a Hall output voltage ΔV(φ1') generated in the Hall element 101 is VH1'+ΔVOFF1', where VH1' denotes an effective signal component and ΔVOFF1' denotes an element off-set component (element off-set voltage).

With this configuration, the positive phase amplification voltage VP(φ1') and the negative phase amplification voltage VN(φ1') outputted from the amplifier circuit 103 are expressed by the following equations (2-9) and (2-10), respectively. The symbol α denotes a differential gain of the amplifier circuit 103 and ΔVOFF_AMP denotes an input off-set voltage of the amplifier circuit 103. VP0 and VN0 denote ideal amplifier output voltages for a differential input voltage of 0V. For example, at times t209 to t211 in FIG. 8, the value of the positive phase amplification voltage VP(φ1') is "P5" and the value of the negative phase amplification voltage VN(φ1') is "M5."

$$VP(\phi1')=+(\alpha/2)\times(VH1'+\Delta VOFF1'+\Delta VOFF\_AMP)+VP0 \quad (2-9)$$

$$VN(\phi1')=(\alpha/2)\times(VH1'+\Delta VOFF1'+\Delta VOFF\_AMP)+VN0 \quad (2-10)$$

At this time, under a state where the second subtraction control signal VREF_EN2 has a low level, i.e., under the second holding state (nφ4) of the subtractor circuit 104, the second positive phase subtraction voltage SHD and the second negative phase subtraction voltage SHB are expressed by the following equations (2-11) and (2-12), respectively, based on the charge conservation in the capacitors CD and CB. For example, at times t209 to t211 in FIG. 8, the value of the second positive phase subtraction voltage SHD is "P5–P4+Vref11" and the value of the second negative phase subtraction voltage SHD is "M5–M4+Vref12."

$$SHD=VP(\phi1')-\{VP(\phi2)-Vref11\} \quad (2-11)$$

$$SHB=VN(\phi1')-\{VN(\phi2)-Vref12\} \quad (2-12)$$

Putting the equations (2-3) and (2-9) in the equation (2-11), the second positive phase subtraction voltage SHD is expressed by the following equation (2-13). Putting the equations (2-4) and (2-10) in the equation (2-12), the second negative phase subtraction voltage SHB is expressed by the following equation (2-14). It is here assumed that VH1'=VH2=VH and ΔVOFF1'=ΔVOFF2.

$$\begin{aligned} SHD &= +(\alpha/2)\times(VH1'+\Delta VOFF1'+\Delta VOFF\_AMP)+ \\ &\quad VP0-(\alpha/2)\times(-VH2+\Delta VOFF2+\Delta VOFF\_AMP)- \\ &\quad VP0+Vref11 \\ &= +\alpha\times VH+Vref11 \end{aligned} \quad (2\text{-}13)$$

$$\begin{aligned} SHB &= -(\alpha/2)\times(VH1'+\Delta VOFF1'+\Delta VOFF\_AMP)+ \\ &\quad VN0+(\alpha/2)\times(-VH2+\Delta VOFF2+\Delta VOFF\_AMP)- \\ &\quad VN0+Vref12 \\ &= -\alpha\times VH+Vref12 \end{aligned} \quad (2\text{-}14)$$

As can be seen from the above equations (2-13) and (2-14), the element off-set voltages ΔVOFF1' and ΔVOFF2 of the Hall element 101 and the input off-set voltage ΔVOFF_AMP of the amplifier circuit 103 are all cancelled out according to the second subtraction process (φ1'–φ2) of the subtractor circuit 104.

For the effective signal component VH differentially inputted from the Hall element 101, an effective signal component (SHB–SHD) differentially outputted from the subtractor circuit 104 is –α×2×VH+(Vref12–Vref11). This is equivalent to the differential output obtained in the first subtraction process (φ2–φ1).

Accordingly, since the magnetic sensor 100 of the second embodiment does not require unnecessary latency time and can perform the first subtraction process (φ2–φ1) and the second subtraction process (φ1'–φ2) in a serial/parallel manner, it is possible to obtain a magnetic field detection signal with off-set cancellation completed (subjected to the subtraction process) every pulse cycle of the clock signal CLK. That is, the magnetic sensor 100 of the second embodiment can double an effective sampling rate (sampling frequency) of a magnetic field as compared to the magnetic sensor 1 of the first embodiment, which may result in an improvement of jitter characteristics (reduction in quantization noise) and quick response to rapid variations of a magnetic field.

[Signal Selection Process in Selector Circuit 105]

Whenever a logic level reverse between the first switch control signal SW1 and the second switch control signal SW2 is performed, the subtractor circuit 104 outputs a first subtraction voltage (either the first positive phase subtraction voltage SHA or the first negative phase subtraction voltage SHC) and a second subtraction voltage (either the second positive phase subtraction voltage SHD or the second negative phase subtraction voltage SHB) in an alternating manner. Under this configuration, the selector circuit 105 selectively outputs one of the first subtraction voltage and the second subtraction voltage according to a first select control signal SH_EN1 and a second select control signal SH_EN2.

More specifically, under a first select state ($\phi$5) under which the first select control signal SH_EN1 has a high level (for example, see time periods t206 to t207 in FIG. 8), the switches SWE(B) and SWF(D) are switched on. Accordingly, the selector circuit 105 outputs the second negative phase subtraction voltage SHB as the first select voltage SHE while charging the capacitor CE with the second negative phase subtraction voltage SHB, and outputs the second positive phase subtraction voltage SHD as the second select voltage SHF while charging the capacitor CF with the second positive phase subtraction voltage SHD. On the other hand, under a second select state ($\phi$6) under which the second select control signal SH_EN2 has a high level (for example, see time periods t208 to t209 in FIG. 8), the switches SWE(A) and SWF(C) are switched on. Accordingly, the selector circuit 105 outputs the first positive phase subtraction voltage SHA as the first select voltage SHE while charging the capacitor CE with the first positive phase subtraction voltage SHA, and outputs the first negative phase subtraction voltage SHC as the second select voltage SHF while charging the capacitor CF with the first negative phase subtraction voltage SHC.

That is, the high level period of the first select control signal (SH_EN1) (for example, see time periods t206 to t207 in FIG. 8) corresponds to a period during which the selector circuit 105 outputs the second subtraction voltages (the second positive phase subtraction voltage SHD and the second negative phase subtraction voltage SHB) as the first and second select voltages SHE and SHF, respectively, while sampling the second subtraction voltages. On the other hand, the high level period of the second select control signal (SH_EN2) (for example, see time periods t208 to t209 in FIG. 8) corresponds to a period during which the selector circuit 105 outputs the first subtraction voltages (the first positive phase subtraction voltage SHA and the first negative phase subtraction voltage SHC) as the first and second select voltages SHE and SHF, respectively, while sampling the first subtraction voltages.

In addition, the period from the time when the first select control signal SH_EN1 has a low level to the time when the second select control signal SH_EN2 has a high level (for example, see time periods t207 to t208 in FIG. 8) corresponds to a period during which the selector circuit 105 outputs the second subtraction voltages (the second positive phase subtraction voltage SHD and the second negative phase subtraction voltage SHB) as the first and second select voltages SHE and SHF, respectively, while holding the second subtraction voltages. On the other hand, the period from the time when the second select control signal SH_EN2 has a low level to the time when the first select control signal SH_EN1 has a high level (for example, see time period of t209 to t210 in FIG. 8) corresponds to a period during which the selector circuit 105 outputs the first subtraction voltages (the first positive phase subtraction voltage SHA and the first negative phase subtraction voltage SHC) as the first and second select voltages SHE and SHF, respectively, while holding the first subtraction voltages.

According to the above-described sample/hold operation, the first select voltage SHE becomes a voltage signal (for example, P2−P1, M3−M2, P4−P3, M5−M4, P6−P5, M7−M6, P8−P7, . . . with the second reference voltage Vref12 as a base in FIG. 8), which is one alternately selected from the first positive phase subtraction voltage SHA and the second negative phase subtraction voltage SHB. In addition, the second select voltage SHF becomes a voltage signal (for example, M2−M1, P3−P2, M4−M3, P5−P4, M6−M5, P7−P6, M8−M7, . . . , with the first reference voltage Vref11 as a base in FIG. 8), which is one alternately selected from the first negative phase subtraction voltage SHC and the second positive phase subtraction voltage SHD.

The selector circuit 105 as configured above can generate the consecutive first and second select voltages SHE and SHF by properly combining the first subtraction voltages SHA and SHC and the second subtraction voltages SHB and SHD. Thus, it is possible to develop an analog-linear output type of Hall IC (Integrated circuit).

In addition to the function of selectively outputting the first subtraction voltages SHA and SHC and the second subtraction voltages SHB and SHD, the selector circuit 105 further includes a function of masking an unnecessary transient waveform which may occur when switching between the bias states, as will be described in more detail later.

[Ripple-Filtering Process in Low Pass Filter Circuit 106]

Since the selector circuit 105 performs the sample/hold operation according to the first and second select control signals SH_EN1 and SH_EN2, both of the first and second select voltages SHE and SHF become a discrete sampling voltage signal. This makes it difficult to completely wipe out deterioration of jitter characteristics due to quantization noise, even though the sampling speed of the subtractor circuit 104 may be raised as high as possible.

The magnetic sensor 100 of the second embodiment is configured to include the low pass filter circuit 106 which generates the first filtered voltage INCH and the second filtered voltage INC12 by smoothing out ripples of the first and second select voltages SHE and SHF, respectively. With this configuration, the discrete first and second select voltages SHE and SHF can be waveform-shaped to supplement intermediate values lost by the sampling operation, which may result in a more ideal linear output.

In addition, a cut-off frequency of the low pass filter circuit may be set to, for example, about 100 kHz, which does not cause attenuation of a detected frequency of a magnetic field.

However, since the low pass filter circuit 106 is accompanied by an increase in circuit area, it may be excluded depending on the requirements of the magnetic sensor 100.

[Comparison Process in Comparator Circuit 107]

Consistent monitoring (sampling monitoring in the first embodiment) of the first and second filtered voltages INC11 and INC12 inputted from the low pass filter circuit 106 allows further improvement to the jitter characteristics and a quick response to rapid variations of a magnetic field. If comparison logic output for a threshold value is performed, a comparator may be used as the comparator circuit 107. On the other hand, if analog linear output is performed, instead of the comparator circuit 107, a differential amplifier circuit may be used to generate a differential amplification signal by amplifying a difference between the first and second filtered voltages INC11 and INC12.

[Signal Generation Process in Timing Logic Circuit 112]

Figure 9:
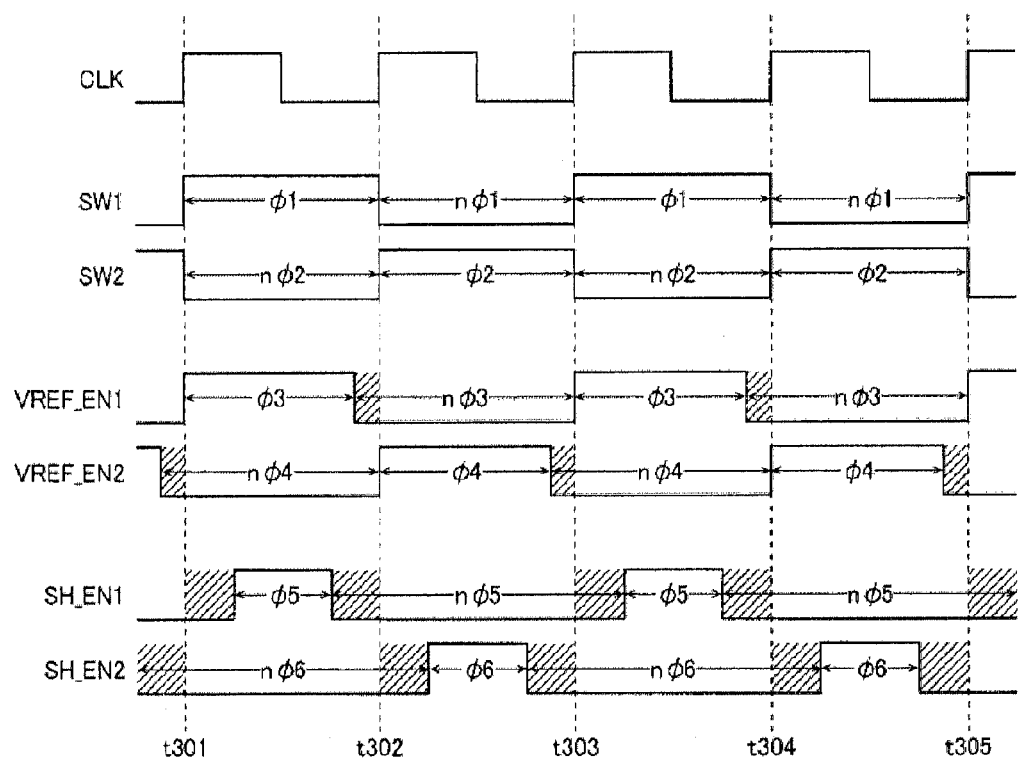
FIG. 9 is a timing chart for explaining a logic switching operation of various control signals.

FIG. 9 is a timing chart for explaining a logic switching operation of various control signals by the timing logic circuit 112, depicting the clock signal CLK, the first switch control signal SW1, the second switch control signal SW2, the first subtraction control signal VREF_EN1, the second subtraction control signal VREF_EN2, the first select control signal SH_EN1 and the second select control signal SH_EN2 in descending order from the top.

As shown in FIG. 9, the timing logic circuit 112 raises the first switch control signal SW1 and the first subtraction control signal VREF_EN1 to a high level simultaneously (or almost simultaneously). In addition, the timing logic circuit 112 raises the second switch control signal SW2 and the second subtraction control signal VREF_EN2 to a high level simultaneously (or almost simultaneously). On the other hand, the timing logic circuit 112 drops the first subtraction control signal VREF_EN1 to a low level before dropping the first switch control signal SW1 to a low level. In addition, the timing logic circuit 112 drops the second subtraction control signal VREF_EN2 to a low level before dropping the second switch control signal SW2 to a low level.

That is, the timing logic circuit 112 switches off the switches SWA and SWC before switching the switch circuit 102 from the first bias state ($\phi 1$) to the second bias state ($\phi 2$). In addition, the timing logic circuit 112 switches off the switches SWB and SWD before switching the switch circuit 102 from the second bias state ($\phi 2$) to the first bias state ($\phi 1$). With this configuration, the subtractor circuit 104 can reliably perform the first subtraction process ($\phi 2-\phi 1$) and the second subtraction process ($\phi 1-\phi 2$) without error.

However, the rising timings of the first and second subtraction control signals VREF_EN1 and VREF_EN2 is not limited to those described above. For example, the timing logic circuit 112 may raise the first subtraction control signal VREF_EN1 to a high level after raising the first switch control signal SW1 to a high level. Similarly, the timing logic circuit 112 may raise the second subtraction control signal VREF_EN2 to a high level after raising the second switch control signal SW2 to a high level.

In addition, the timing logic circuit 112 may raise the first select control signal SH_EN1 to a high level after dropping the second subtraction control signal VREF_EN2 to a low level, and also drop the first select control signal SH_EN1 to a low level before raising the second subtraction control signal VREF_EN2 to a high level. Further, the timing logic circuit 112 may raise the second select control signal SH_EN2 to a high level after dropping the first subtraction control signal VREF_EN1 to a low level, and also drop the second select control signal SH_EN2 to a low level before raising the first subtraction control signal VREF_EN1 to a high level.

That is, the timing logic circuit 112 switches on the switches SWE(A) and SWF(C) after switching off the switches SWA and SWC, and also switches off the switches SWE(A) and SWF(C) before switching on the switches SWA and SWC. In addition, the timing logic circuit 112 switches on the switches SWE(B) and SWF(D) after switching off the switches SWB and SWD, and also switches off the switches SWE(B) and SWF(D) before switching on the switches SWB and SWD. With this configuration, the selector circuit 105 can reliably perform the selection process without error.

Further, the timing logic circuit 112 raises the first select control signal SH_EN1 to a high level with a lapse of a predetermined masking time after the first switch control signal SW1 has risen to a high level. In addition, the timing logic circuit 112 raises the second select control signal SH_EN2 to a high level with a lapse of a predetermined masking time after the second switch control signal SW2 has risen to a high level. This configuration makes it possible to properly mask an unnecessary transient waveform of the amplifier circuit 103 which may occur when switching between the bias states.

Third Embodiment

Figure 11:
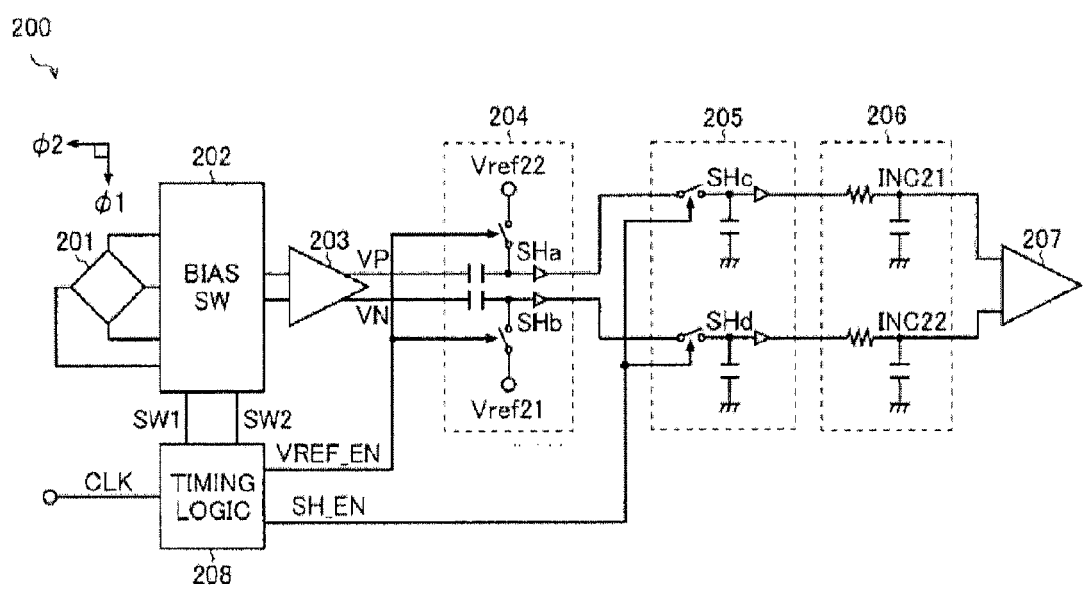
FIG. 11 is a view showing a magnetic sensor according to a third embodiment of the present disclosure.

FIG. 11 is a view showing a magnetic sensor according to a third embodiment of the present disclosure. A magnetic sensor 200 according to the third embodiment includes a Hall element 201, a switch circuit 202, an amplifier circuit 203, a subtractor circuit 204, a sample/hold circuit 205, a low pass filter circuit 206, a comparator circuit 207, and a timing logic circuit 208.

The Hall element 201 is a magneto-electric transducer which generates a Hall voltage depending on the strength of a magnetic field applied thereto. The Hall element 201 has the same configuration and operation as the Hall element 10 of the first embodiment and therefore, explanation of which will not be repeated.

The switch circuit 202 alternates between a first bias state ($\phi 1$) under which a bias voltage in a first direction is applied to the Hall element 201 to acquire a Hall voltage and a second bias state ($\phi 2$) under which a bias voltage in a second direction perpendicular to the first direction is applied to the Hall element 201 to acquire a Hall voltage. The switch circuit 202 has the same configuration and operation as the switch circuit 20 of the first embodiment and therefore, explanation of which will not be repeated.

The amplifier circuit 203 amplifies the Hall voltages inputted through the switch circuit 202 to generate amplification voltages (a positive phase amplification voltage VP and a negative phase amplification voltage VN which are in reverse phase). The amplifier circuit 203 has the same configuration and operation as the amplifier circuit 30 of the first embodiment and therefore, explanation of which will not be repeated.

The subtractor circuit 204 generates a positive phase subtraction voltage SHa and a negative phase subtraction voltage SHb by subtracting a positive phase amplification voltage VP($\phi 1$) and a negative phase amplification voltage VN($\phi 1$) obtained under the prior first bias state ($\phi 1$) from a positive phase amplification voltage VP($\phi 2$) and a negative phase amplification voltage VN($\phi 2$) obtained under the second bias state ($\phi 2$), respectively. The subtractor circuit 204 has the same configuration and operation as the subtractor circuit 40 of the first embodiment and therefore, explanation of which will not be repeated.

The sample/hold circuit 205 generates a positive phase sample/hold voltage SHc obtained by sampling/holding the positive phase subtraction voltage SHa and a negative phase sample/hold voltage SHd obtained by sampling/holding the negative phase subtraction voltage SHb.

The low pass filter circuit 206 generates a first filtered voltage (first comparison voltage) INC21 obtained by smoothing out the positive phase sample/hold voltage SHc and a second filtered voltage (second comparison voltage) INC22 obtained by smoothing out the negative phase sample/hold voltage SHd.

The comparator circuit 207 compares the first filtered voltage INC21 with the second filtered voltage INC22 to generate a comparison output signal. The comparator circuit 207 has the same configuration and operation as the comparator circuit 50 of the first embodiment and therefore, explanation of which will not be repeated.

In synchronization with the clock signal CLK having a predetermined frequency, the timing logic circuit 208 generates a first switch control signal SW1, a second switch control signal SW2, a subtraction control signal VREF_EN and a sample/hold control signal SH_EN, and controls operation timings of the switch circuit 202, the subtractor circuit 204 and the sample/hold circuit 205.

The first switch control signal SW1 and the second switch control signal SW2 are control signals for switching the bias direction of the Hall element 201 vertically (0°/90°) and are supplied to the switch circuit 202. The subtraction control signal VREF_EN is a switching-on/off control signal of switches included in the subtractor circuit 204 and is supplied to the subtractor circuit 204. The sample/hold control signal SH_EN is a switching-on/off control signal of switches included in the sample/hold circuit 205 and is supplied to the sample/hold circuit 205.

Figure 12:
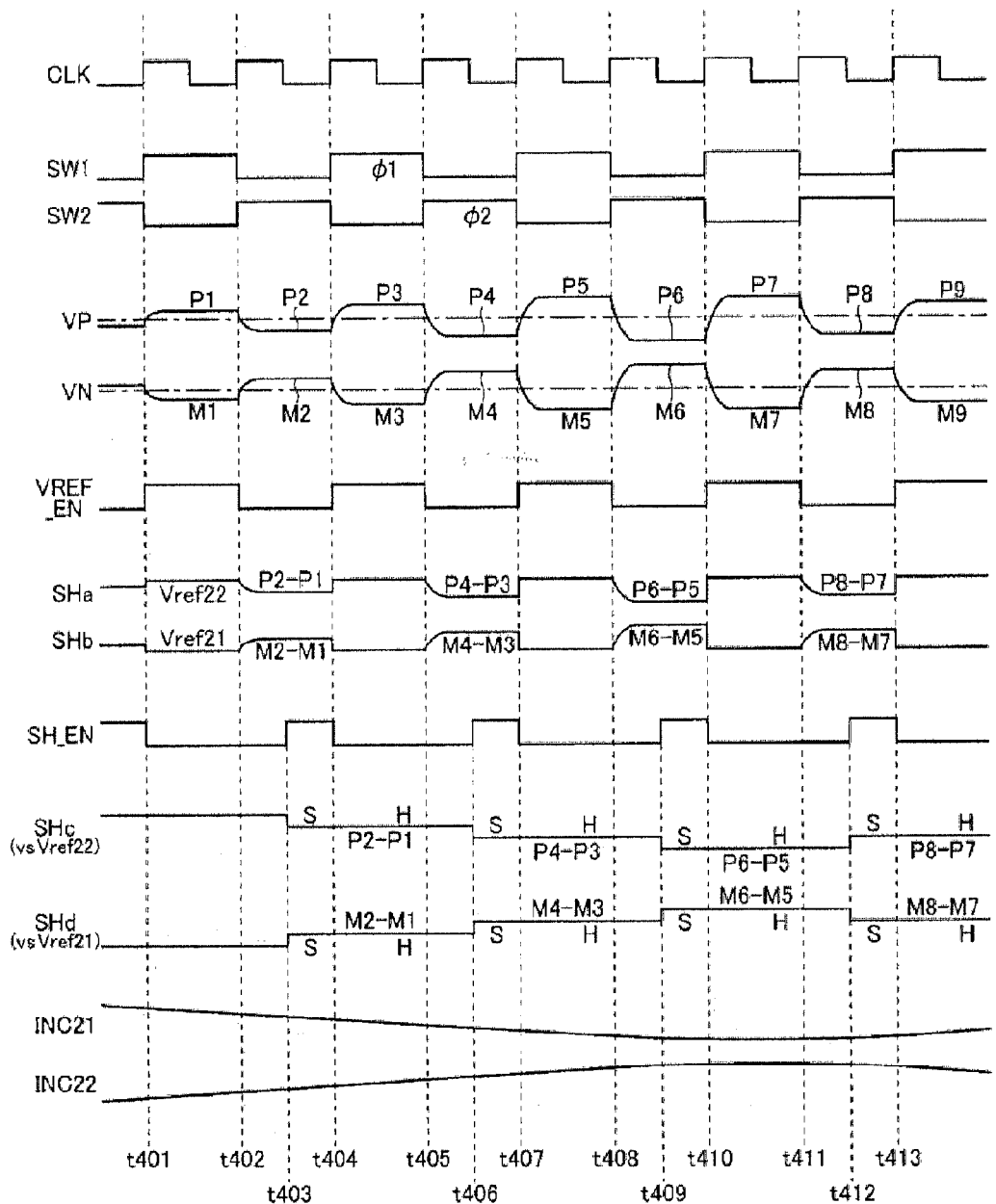
FIG. 12 is a timing chart for explaining an operation of the magnetic sensor in FIG. 11.

FIG. 12 is a timing chart for explaining an operation of the magnetic sensor 200, depicting the clock signal CLK, the first switch control signal SW1, the second switch control signal SW2, the positive phase amplification voltage VP, the negative phase amplification voltage VN, the subtraction control signal VREF_EN, the positive phase subtraction voltage SHa, the negative phase subtraction voltage SHb, the sample/hold control signal SH_EN, the positive phase sample/hold voltage SHc, the negative phase sample/hold voltage SHd, the first comparison voltage INC21 and the second comparison voltage INC22 in descending order from the top.

As described above, the magnetic sensor 200 of the third embodiment is configured to interpose the sample/hold circuit 205 and the low pass filter circuit 206 between the subtractor circuit 204 and the comparator circuit 207 based on the magnetic sensor 10 of the first embodiment.

Accordingly, the magnetic sensor 200 of the third embodiment can use the interposed sample/hold circuit 205 to perform a process of masking an unnecessary transient waveform which may occur when switching between the bias states.

In addition, the magnetic sensor 200 of the third embodiment can use the interposed low pass filter circuit 206 to achieve an improvement to jitter characteristics (reduction of quantization noise).

In the magnetic sensor 200 of the third embodiment, unlike the magnetic sensor 100 of the second embodiment, a direction of the subtracting process in the subtractor circuit 204 is limited to "φ2−φ1." Accordingly, in order for the magnetic sensor 200 of the third embodiment to obtain the first and second comparison voltages INC21 and INC22 with their off-sets cancelling each other (i.e., subjected to the subtraction process), like the magnetic sensor 1 of the first embodiment, there is need of a clock signal CLK of two cycles. Accordingly, stressing an increase in a magnetic field sampling rate and an improvement to jitter characteristics (reduction in quantization noise), the second embodiment may be employed. On the other hand, putting a reduction in a circuital scale of the magnetic sensor 200 ahead of an increase in a magnetic field sampling rate, employing the third embodiment has its own value.

According to the present disclosure in some embodiments, it is possible to provide a magnetic sensor which is capable of cancelling off-sets of a magneto-electric transducer and an amplifier, and achieving high speed sampling of a magnetic field and improvement to jitter characteristics.

While certain embodiments have been described, these embodiments have been presented by way of example only, and are not intended to limit the scope of the disclosures. Indeed, the novel methods and apparatuses described herein may be embodied in a variety of other forms; furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

INDUSTRIAL APPLICABILITY

The present disclosure can be used for technologies for realizing an improvement to speed and precision of detection of a magnetic sensor. For example, the magnetic sensors of the present disclosure may be used as a means for detecting fast rotation of a motor and so on. Further, the magnetic sensors may be used as a rotation speed sensor for a cam shaft or a crank shaft, a wheel speed sensor, a car speed sensor, a rotation speed sensor for a power window driving motor, etc. in the automotive field. The magnetic sensors of the present disclosure may be used as a means for detecting the position and angle of objects. The magnetic sensors may be used as various sensors to detect electronic throttle opening, accelerator pedal position, brake pedal position, wiper angle, mirror angle, etc. in the automotive field. The magnetic sensors may be used as a means for detecting a position of an auto-focusing lens in the public livelihood field. The magnetic sensors of the present disclosure may be used as a means for detecting proximity (opening/closing) of objects. The magnetic sensors may be used as a placement detection switch of a short belt in the automotive field. In addition, the magnetic sensors may be used as an opening/closing detection switch of a folder type mobile phone and a slide type mobile phone.

What is claimed is:

1. A magnetic sensor comprising:
 a magneto-electric transducer which generates an output voltage depending on a strength of a magnetic field;
 a switch circuit which alternately switches between a first bias state under which a bias voltage in a first direction is applied to the magneto-electric transducer to acquire the output voltage and a second bias state under which a bias voltage in a second direction perpendicular to the first direction is applied to the magneto-electric transducer to acquire the output voltage;
 an amplifier circuit which generates an amplification voltage by amplifying the output voltage;
 a subtractor circuit which performs a first subtraction process of generating a first subtraction voltage by subtracting an amplification voltage obtained under an immediately prior first bias state from an amplification voltage obtained under the second bias state and a second subtraction process of generating a second subtraction voltage by subtracting an amplification voltage obtained under an immediately prior second bias state from an amplification voltage obtained under the first bias state in a serial and parallel manner;
 a selector circuit which alternately selects the first subtraction voltage and the second subtraction voltage to output a select voltage; and
 a filter circuit which generates a filtered voltage by smoothing out ripples of the select voltage,
 wherein the amplifier circuit generates, as the amplification voltage, a positive phase amplification voltage and a negative phase amplification voltage which are in reversed phases,
 wherein the subtractor circuit generates, as the first subtraction voltage, a first positive phase subtraction voltage and a first negative phase subtraction voltage, the first positive phase subtraction voltage calculated by subtracting the positive phase amplification voltage obtained under the immediately prior first bias state from the positive phase amplification voltage obtained under the second bias state, and the first negative phase subtraction voltage calculated by subtracting the negative phase amplification voltage obtained under the immediately prior first bias state from the negative phase amplification voltage obtained under the second bias state, and wherein the subtractor circuit generates, as the second subtraction voltage, a second positive phase subtraction voltage and a second negative phase subtraction voltage, the second positive phase subtraction voltage calculated by subtracting the positive phase amplification voltage obtained under the immediately prior second bias state from the positive phase amplification voltage obtained under the first bias state, and the second negative phase subtraction voltage calculated by subtracting the negative phase amplification voltage obtained under the immediately prior second bias state from the negative phase amplification voltage obtained under the first bias state.

2. The magnetic sensor of claim 1, wherein the selector circuit generates, as the select voltage, a first select voltage which is alternately selected from the first positive phase subtraction voltage and the second negative phase subtraction voltage, and a second select voltage which is alternately selected from the first negative phase subtraction voltage and the second positive phase subtraction voltage.

3. The magnetic sensor of claim 2, wherein the filter circuit generates, as the filtered voltage, a first filtered voltage by smoothing out ripples of the first select voltage and a second filtered voltage by smoothing out ripples of the second select voltage.

4. The magnetic sensor of claim 3, further comprising a timing logic circuit which controls operation timings of the switch circuit, the subtractor circuit and the selector circuit in synchronization with a clock signal having a predetermined frequency.

5. The magnetic sensor of claim 4, wherein the subtractor circuit includes:
- a first capacitor having a first end connected to an application terminal of the positive phase amplification voltage and a second end connected to an application terminal of the first positive phase subtraction voltage;
- a second capacitor having a first end connected to an application terminal of the negative phase amplification voltage and a second end connected to an application terminal of the second negative phase subtraction voltage;
- a third capacitor having a first end connected to the application terminal of the negative phase amplification voltage and a second end connected to an application terminal of the first negative phase subtraction voltage;
- a fourth capacitor having a first end connected to the application terminal of the positive phase amplification voltage and a second end connected to an application terminal of the second positive phase subtraction voltage;
- a first switch connected between the second end of the first capacitor and an application terminal of a second reference voltage;
- a second switch connected between the second end of the second capacitor and the application terminal of the second reference voltage;
- a third switch connected between the second end of the third capacitor and an application terminal of a first reference voltage; and
- a fourth switch connected between the second end of the fourth capacitor and the application terminal of the first reference voltage.

6. The magnetic sensor of claim 5, wherein the timing logic circuit switches on the first switch and the third switch when the switch circuit is in the first bias state, and switches on the second switch and the fourth switch when the switch circuit is in the second bias state.

7. The magnetic sensor of claim 6, wherein the timing logic circuit switches off the first switch and the third switch before the switch circuit is switched from the first bias state to the second bias state, and switches off the second switch and the fourth switch before the switch circuit is switched from the second bias state to the first bias state.

8. The magnetic sensor of claim 7, wherein the selector circuit includes:
- a fifth switch connected between the application terminal of the first positive phase subtraction voltage and an application terminal of the first select voltage;
- a sixth switch connected between the application terminal of the second negative phase subtraction voltage and the application terminal of the first select voltage;
- a seventh switch connected between the application terminal of the first negative phase subtraction voltage and an application terminal of the second select voltage;
- an eighth switch connected between the application terminal of the second positive phase subtraction voltage and the application terminal of the second select voltage;
- a fifth capacitor connected between the application terminal of the first select voltage and a ground terminal; and
- a sixth capacitor connected between the application terminal of the second select voltage and the ground terminal.

9. The magnetic sensor of claim 8, wherein the timing logic circuit switches on the fifth switch and the seventh switch after switching off the first switch and the third switch, switches off the fifth switch and the seventh switch before switching on the first switch and the third switch, switches on the sixth switch and the eighth switch after switching off the second switch and the fourth switch, and switches off the sixth switch and the eighth switch before switching on the second switch and the fourth switch.

10. The magnetic sensor of claim 9, wherein the timing logic circuit switches on the sixth switch and the eighth switch with a lapse of a predetermined masking time after the switch circuit is switched from the second bias state to the first bias state, and switches on the fifth switch and the seventh switch with a lapse of a predetermined masking time after the switch circuit is switched from the first bias state to the second bias state.

11. The magnetic sensor of claim 5, wherein at least one of the first reference voltage and the second reference voltage has a variable voltage value.

12. The magnetic sensor of claim 3, further comprising a comparator circuit which compares the first filtered voltage with the second filtered voltage to generate a comparison output signal.

13. The magnetic sensor of claim 3, further comprising a differential amplifier circuit which amplifies a difference between the first filtered voltage and the second filtered voltage to generate a differential amplification signal.

14. The magnetic sensor of claim 1, wherein the magnetoelectric transducer is a Hall element.

* * * * *